(12) United States Patent
Moriyama et al.

(10) Patent No.: US 11,024,645 B2
(45) Date of Patent: Jun. 1, 2021

(54) THREE-DIMENSIONAL MEMORY DEVICE CONTAINING A SILICON NITRIDE RING IN AN OPENING IN A MEMORY FILM AND METHOD OF MAKING THE SAME

(71) Applicant: SANDISK TECHNOLOGIES LLC, Addison, TX (US)

(72) Inventors: Takumi Moriyama, Yokkaichi (JP); Yasushi Dowaki, Yokkaichi (JP); Yuki Kasai, Kuwana (JP); Satoshi Shimizu, Yokkaichi (JP); Jayavel Pachamuthu, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 99 days.

(21) Appl. No.: 16/583,906

(22) Filed: Sep. 26, 2019

(65) Prior Publication Data
US 2021/0036004 A1    Feb. 4, 2021

Related U.S. Application Data

(63) Continuation-in-part of application No. 16/526,128, filed on Jul. 30, 2019.

(51) Int. Cl.
*H01L 27/11582* (2017.01)
*H01L 27/11524* (2017.01)
(Continued)

(52) U.S. Cl.
CPC .... *H01L 27/11582* (2013.01); *H01L 21/0217* (2013.01); *H01L 23/5226* (2013.01);
(Continued)

(58) Field of Classification Search
CPC .......... H01L 27/11582; H01L 23/5283; H01L 21/0217
See application file for complete search history.

(56) References Cited

U.S. PATENT DOCUMENTS 5,915,167 A    6/1999   Leedy
6,005,285 A    12/1999  Gardner et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Shih Tsun A Chou
(74) *Attorney, Agent, or Firm* — The Marbury Law Group PLLC

(57) ABSTRACT

An alternating stack of insulating layers and sacrificial material layers is formed over a substrate. A memory opening is formed through the alternating stack. A memory film including a silicon nitride layer and a tunneling dielectric layer is formed in the memory opening, and an opening is formed through the memory film. A chemical oxide layer is formed on a physically exposed surface of an underlying semiconductor material portion. A silicon nitride ring can be formed by selectively growing a silicon nitride material from an annular silicon nitride layer portion of the silicon nitride layer while suppressing deposition of the silicon nitride material on the tunneling dielectric layer and on the chemical oxide layer. A vertical semiconductor channel can be formed by depositing a continuous semiconductor material layer on the underlying semiconductor material portion and the tunneling dielectric layer and on the silicon nitride ring.

12 Claims, 26 Drawing Sheets

(51) Int. Cl.
*H01L 27/11556* (2017.01)
*H01L 23/522* (2006.01)
*H01L 21/02* (2006.01)
*H01L 23/528* (2006.01)
*H01L 27/1157* (2017.01)

(52) U.S. Cl.
CPC ...... *H01L 23/5283* (2013.01); *H01L 27/1157* (2013.01); *H01L 27/11524* (2013.01); *H01L 27/11556* (2013.01)

(56) References Cited

U.S. PATENT DOCUMENTS

| | | | |
|---|---|---|---|
| 9,230,980 | B2 | 1/2016 | Rabkin et al. |
| 9,524,977 | B2 | 12/2016 | Sharangpani et al. |
| 9,530,785 | B1 | 12/2016 | Koka et al. |
| 9,576,967 | B1 | 2/2017 | Kimura et al. |
| 9,627,395 | B2 | 4/2017 | Zhang et al. |
| 9,754,958 | B2 * | 9/2017 | Pachamuthu ....... H01L 29/7883 |
| 9,799,669 | B2 | 10/2017 | Rabkin et al. |
| 9,842,851 | B2 | 12/2017 | Pachamuthu et al. |
| 9,870,945 | B2 | 1/2018 | Pachamuthu et al. |
| 10,121,794 | B2 | 11/2018 | Gunji-Yoneoka et al. |
| 2015/0076586 | A1 | 3/2015 | Rabkin et al. |
| 2016/0056169 | A1 | 2/2016 | Lee et al. |
| 2016/0111432 | A1* | 4/2016 | Rabkin ............. H01L 27/11556 257/314 |
| 2016/0126253 | A1* | 5/2016 | Lee ................... H01L 27/11582 257/324 |
| 2016/0268209 | A1 | 9/2016 | Pachamuthu et al. |
| 2016/0307908 | A1 | 10/2016 | Sharangpani et al. |
| 2017/0103997 | A1 | 4/2017 | Lee et al. |
| 2017/0125437 | A1 | 5/2017 | Pachamuthu et al. |
| 2017/0125438 | A1 | 5/2017 | Pachamuthu et al. |
| 2017/0365613 | A1 | 12/2017 | Gunji-Yoneoka et al. |
| 2019/0019809 | A1 | 1/2019 | Lee et al. |
| 2019/0348434 | A1 | 11/2019 | Shioda et al. |

OTHER PUBLICATIONS

U.S. Appl. No. 16/200,115, filed Nov. 26, 2018, SanDisk Technologies LLC.
U.S. Appl. No. 16/224,367, filed Dec. 18, 2018, SanDisk Technologies LLC.
U.S. Appl. No. 16/290,277, filed Mar. 1, 2019, SanDisk Technologies LLC.
U.S. Appl. No. 16/291,673, filed Mar. 4, 2019, SanDisk Technologies LLC.
U.S. Appl. No. 16/295,206, filed Mar. 7, 2019, SanDisk Technologies LLC.
U.S. Appl. No. 16/407,310, filed May 9, 2019, SanDisk Technologies LLC.
U.S. Appl. No. 16/526,128, filed Jul. 30, 2019, SanDisk Technologies LLC.
U.S. Appl. No. 16/556,854, filed Aug. 30, 2019, SanDisk Technologies LLC.
U.S. Appl. No. 16/556,919, filed Aug. 30, 2019, SanDisk Technologies LLC.
USPTO Office Communication, Non-Final Office Action, for U.S. Appl. No. 16/526,128, dated Jun. 12, 2020, 19 pages.
Sze, S. M. et al., "Physics of Semiconductor Devices," by John Wiley & Sons, Inc., pp. 16-32, (2007).
USPTO Office Communication, Non-Final Office Action, for U.S. Appl. No. 16/556,854, dated May 29, 2020, 20 pages.
USPTO Office Communication, Non-Final Office Action, for U.S. Appl. No. 16/556,919, dated May 29, 2020, 16 pages.

* cited by examiner

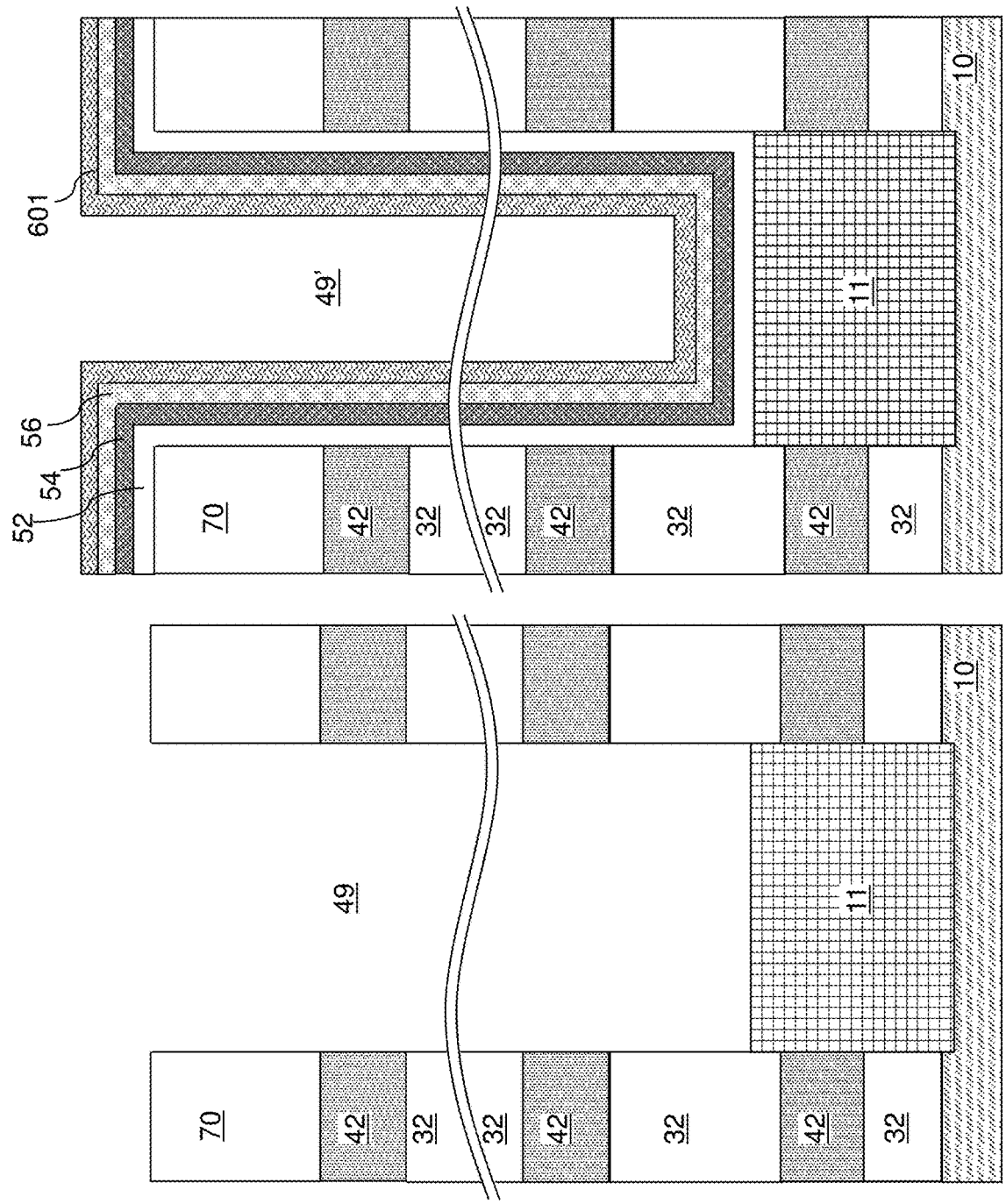

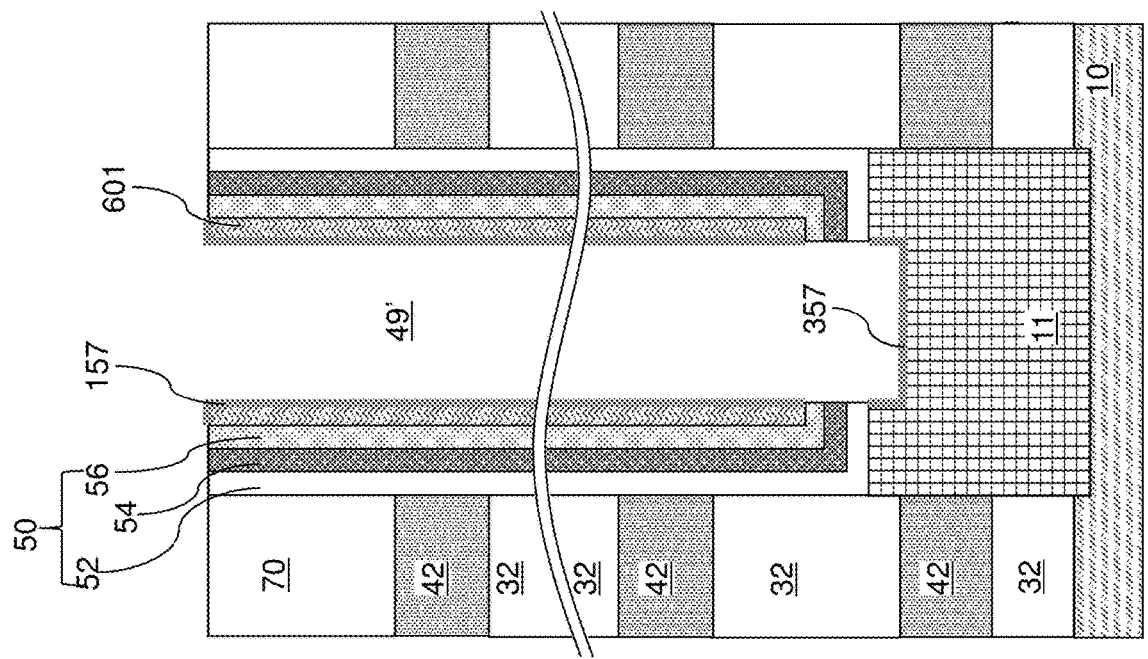
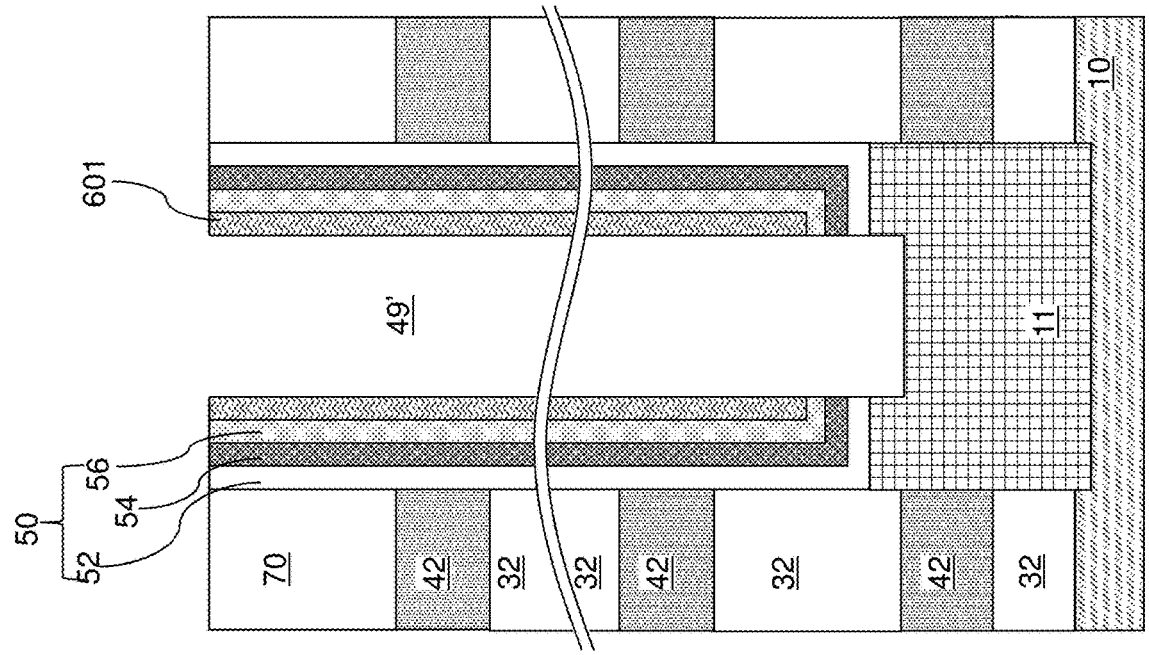

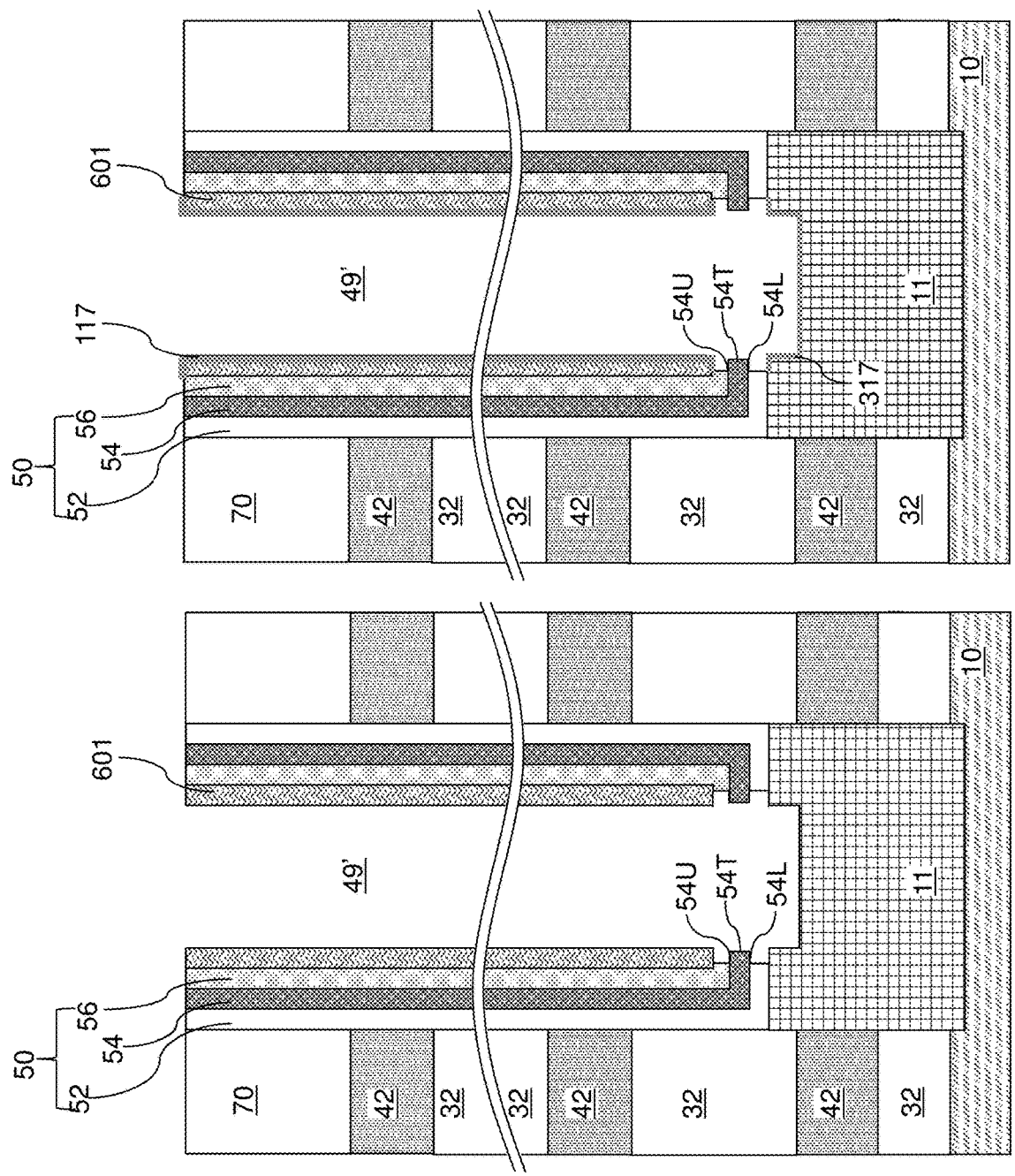

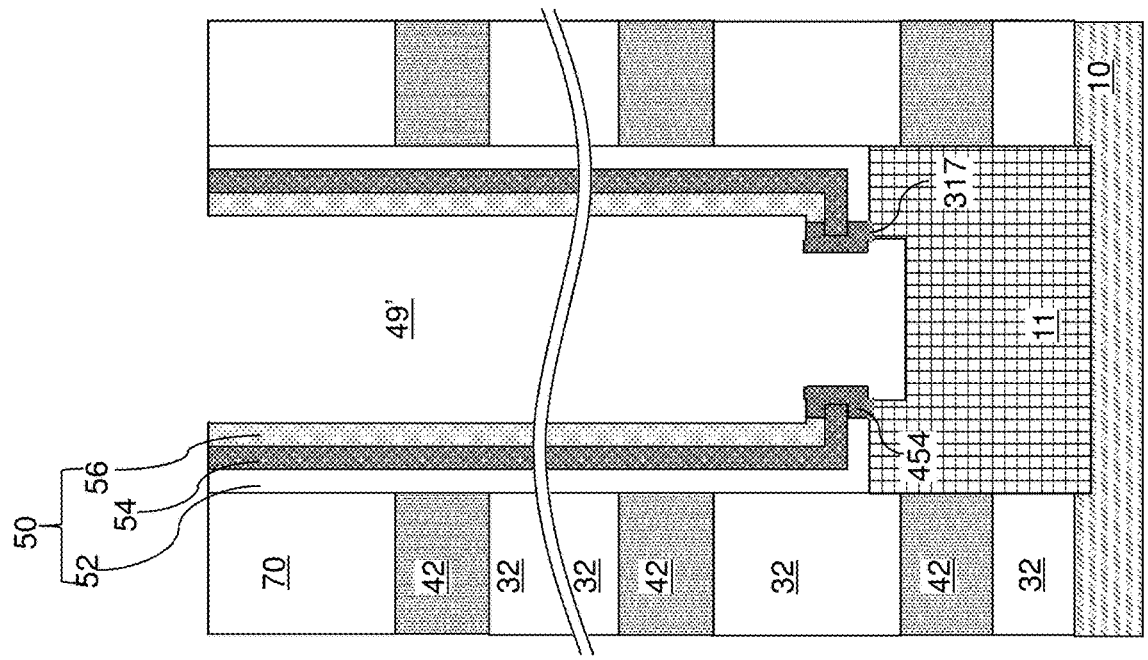
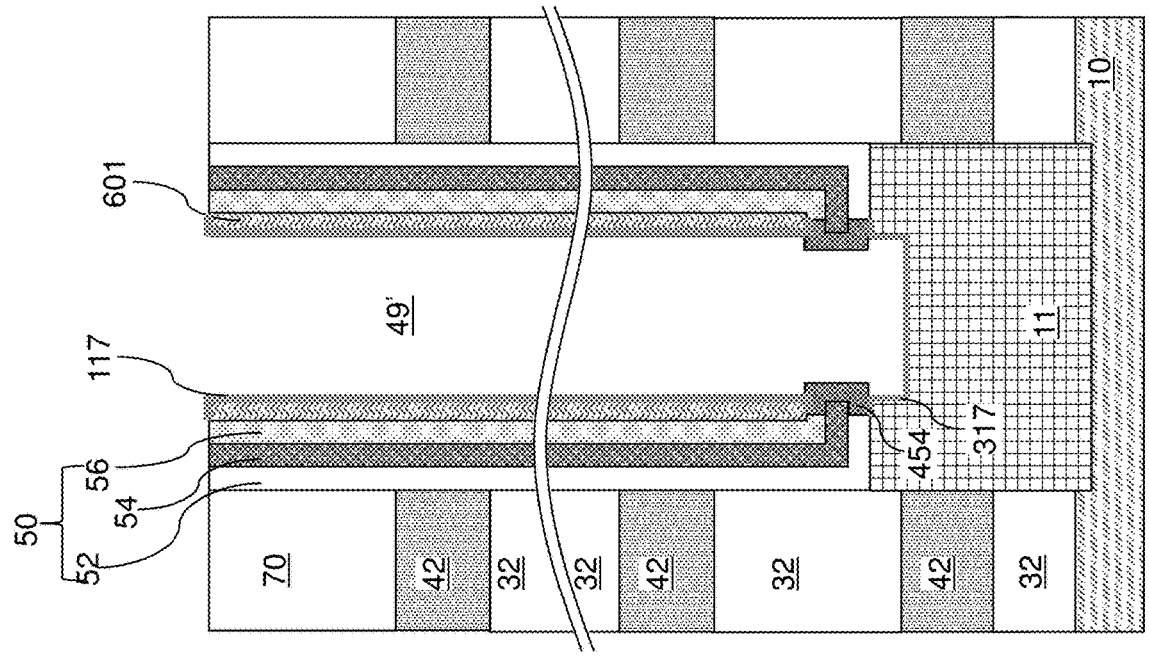

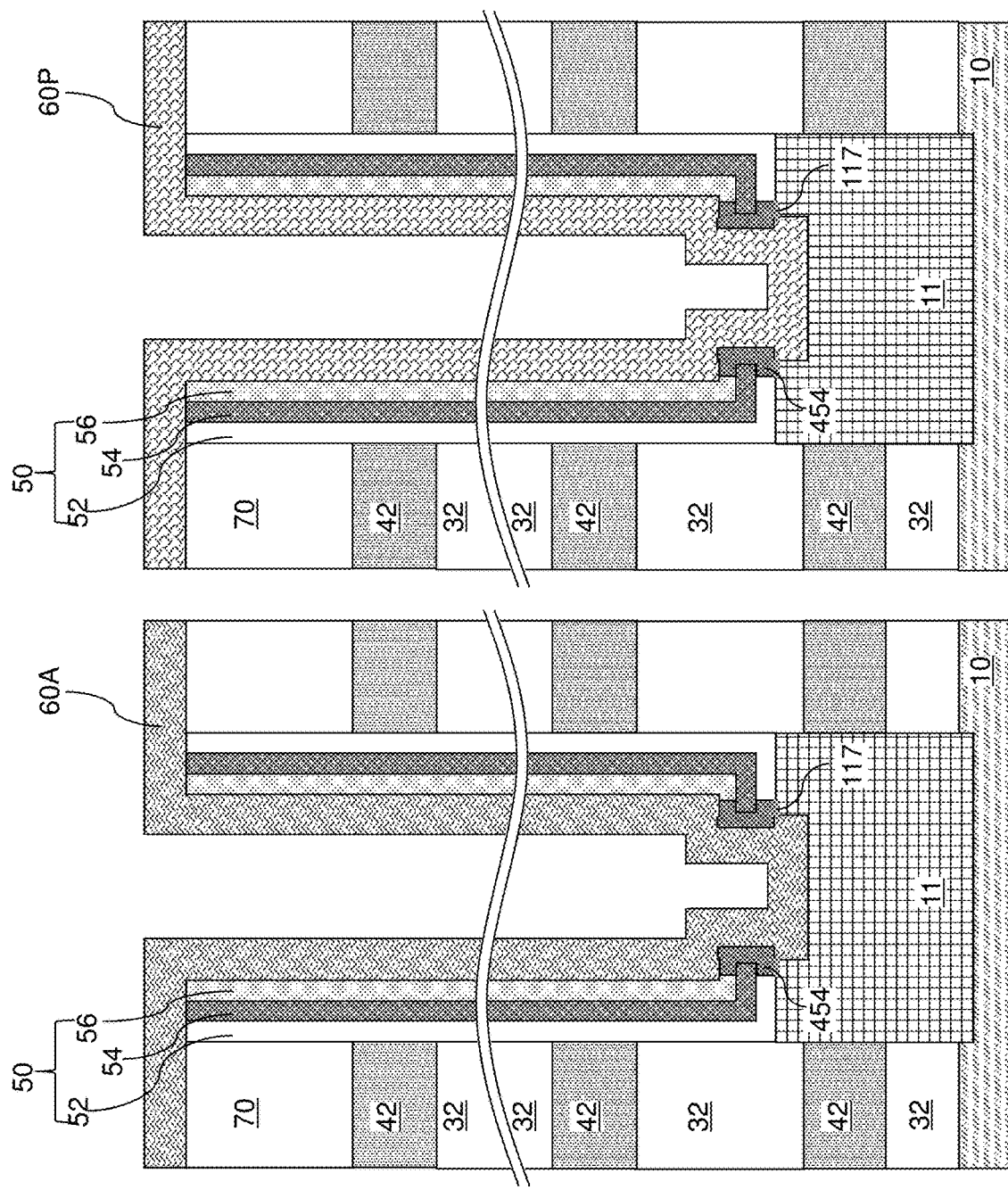

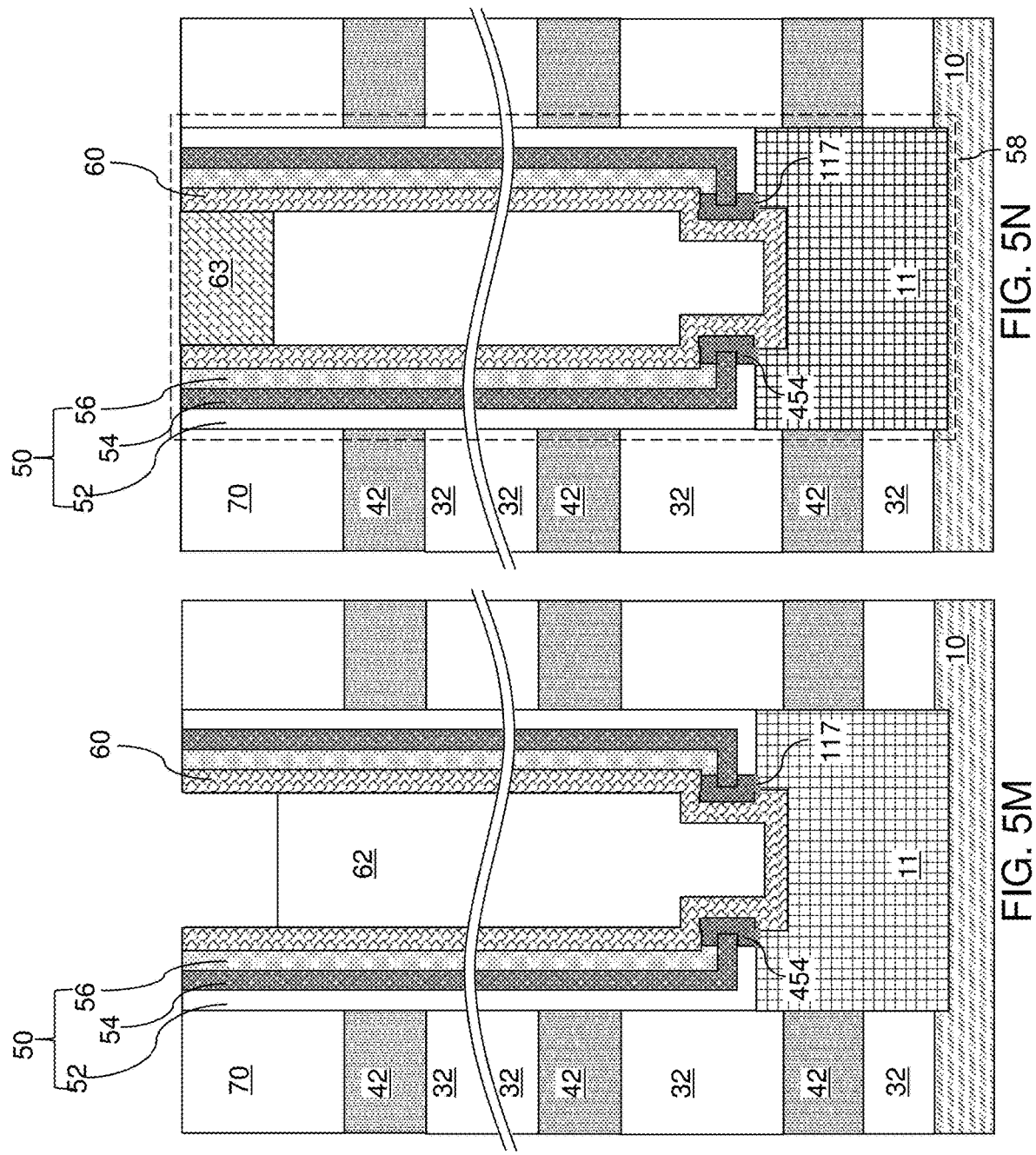

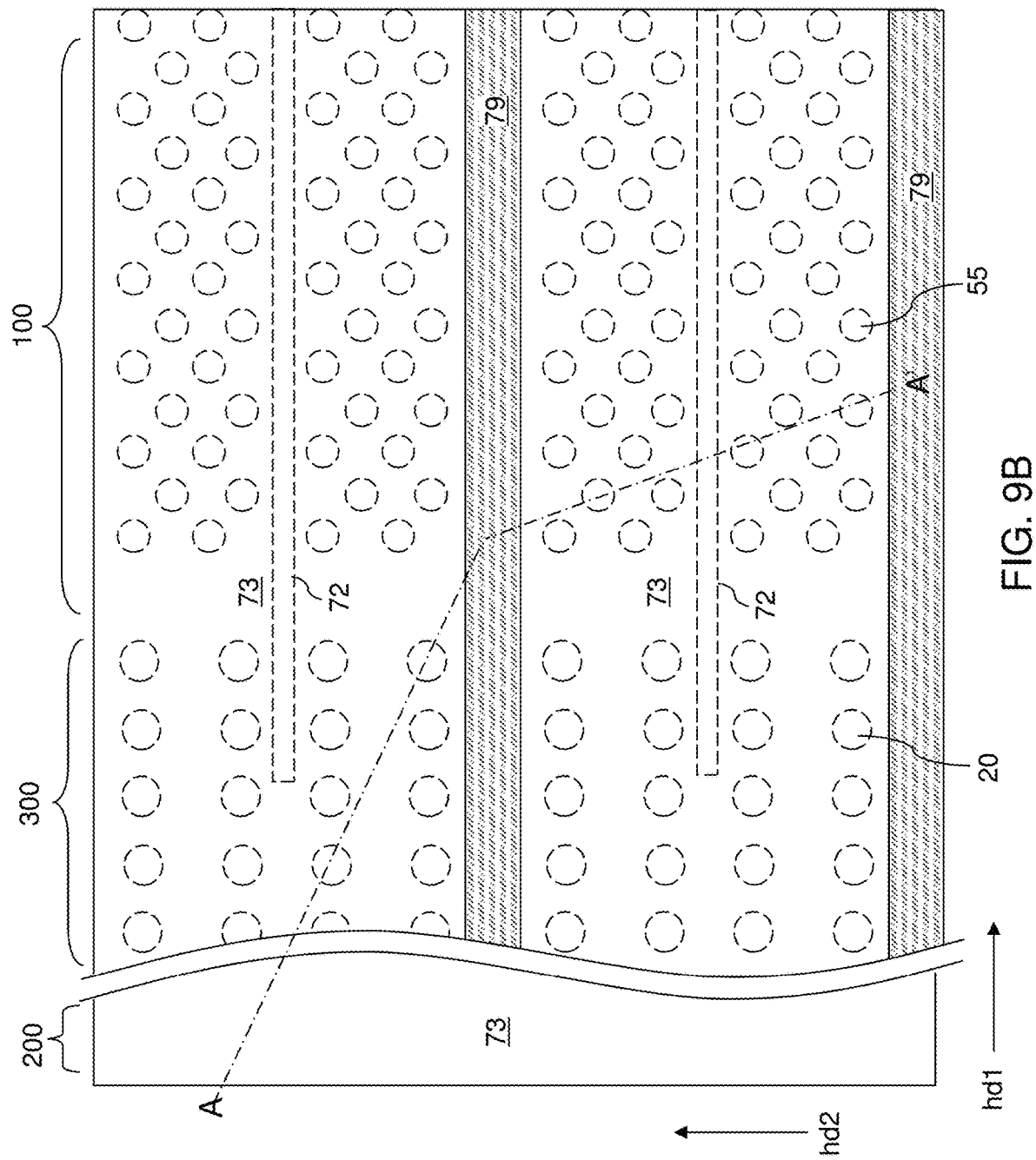

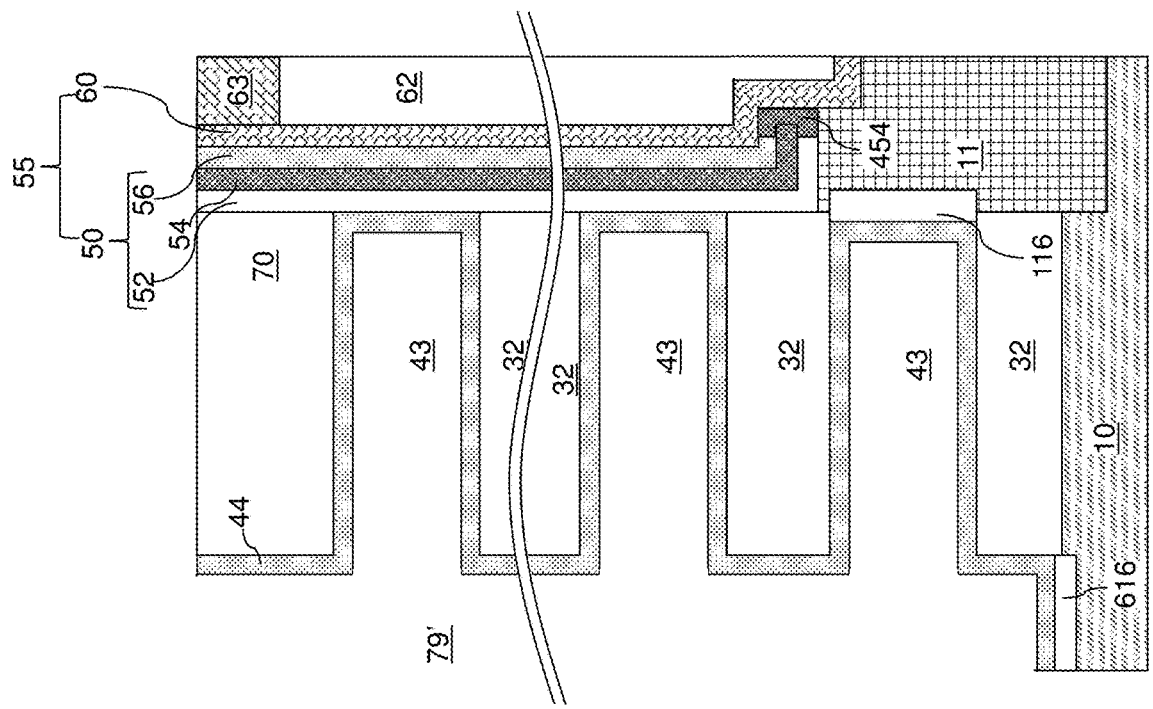
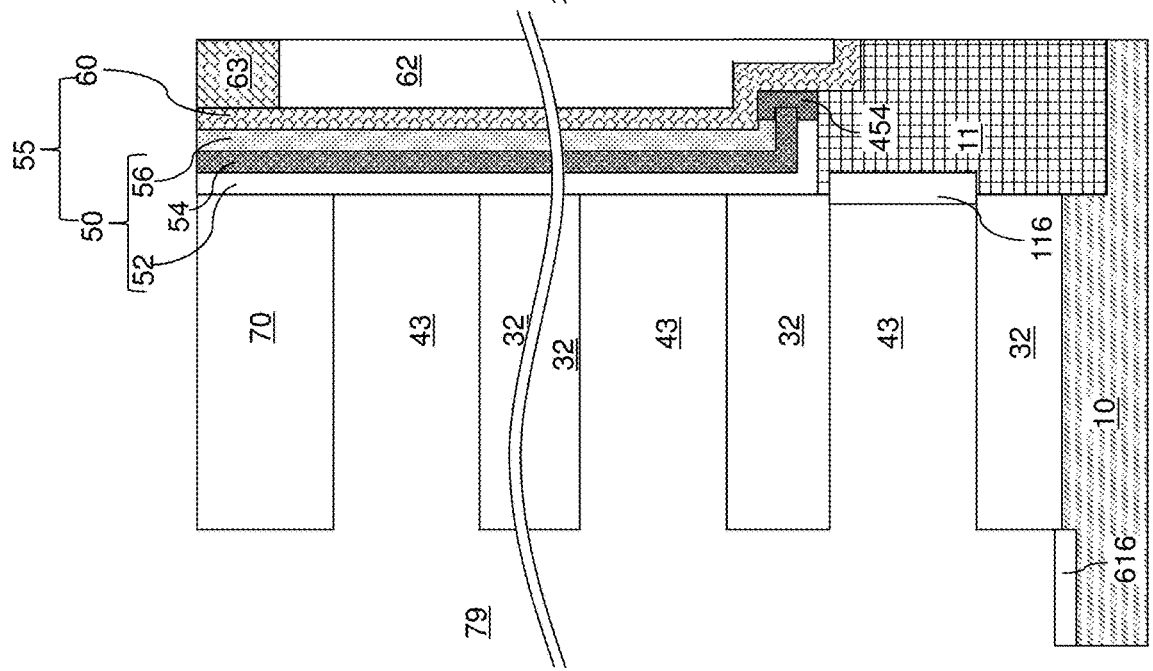

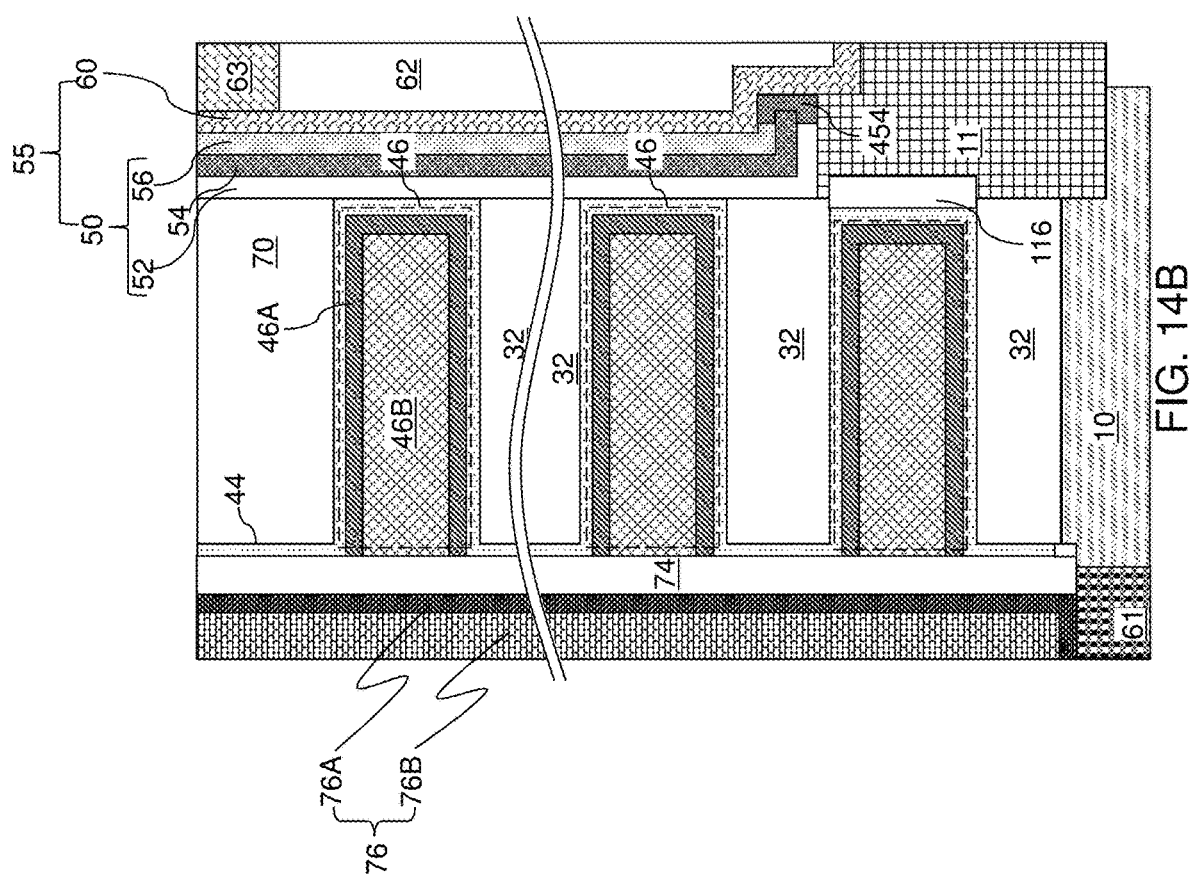

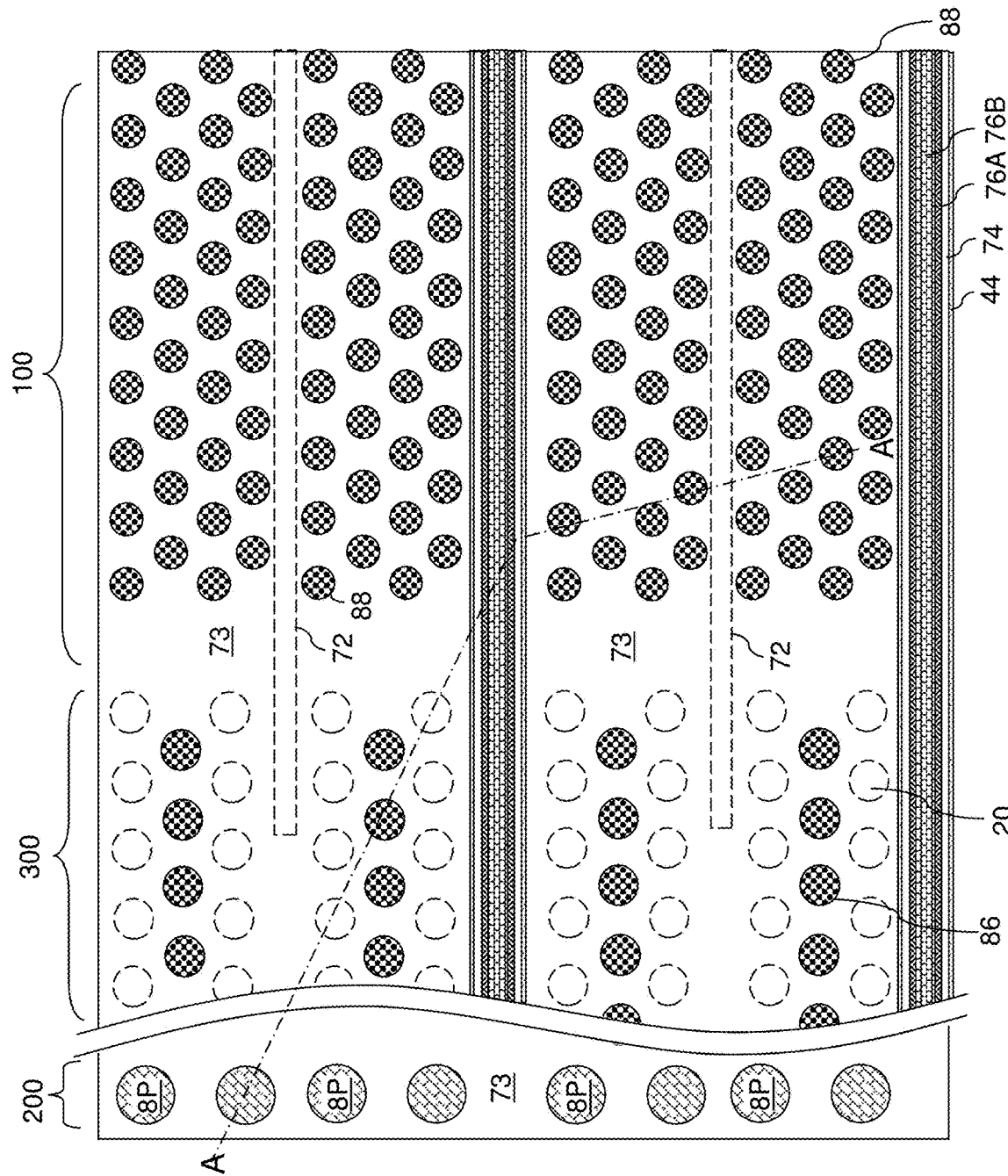

THREE-DIMENSIONAL MEMORY DEVICE CONTAINING A SILICON NITRIDE RING IN AN OPENING IN A MEMORY FILM AND METHOD OF MAKING THE SAME

FIELD

The present disclosure relates generally to the field of semiconductor devices, and particularly to a three-dimensional memory device including a silicon nitride ring in an opening in a memory film for providing a uniform-thickness vertical semiconductor channel therethrough and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate; memory openings vertically extending through the alternating stack; and memory opening fill structures located within a respective one of the memory openings, wherein each of the memory opening fill structures comprises: a memory film contacting a sidewall of a respective memory opening, comprising a layer stack including at least a tunneling dielectric layer and a silicon nitride layer, and including an opening at a bottom portion thereof; a silicon nitride ring contacting a sidewall of the opening in the memory film; and a vertical semiconductor channel contacting an inner sidewall of a vertically-extending portion of the memory film and extending through the silicon nitride ring and contacting a semiconductor material portion that underlies the memory film and the silicon nitride ring, wherein the silicon nitride ring vertically extends from a top surface of the semiconductor material portion to a periphery of an interface between the tunneling dielectric layer and the vertical semiconductor channel.

According to another embodiment of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers; forming a memory opening through the alternating stack; forming a memory film in the memory opening, wherein the memory film includes a layer stack comprising a silicon nitride layer and a tunneling dielectric layer, and an opening is present at a bottom portion of the memory film, and a surface of an underlying semiconductor material portion is physically exposed at a bottom of the opening in the memory film; forming a chemical oxide layer on the physically exposed surface of the underlying semiconductor material portion; forming a silicon nitride ring by selectively growing a silicon nitride material from a physically exposed sidewall of an annular silicon nitride layer portion of the silicon nitride layer while suppressing deposition of the silicon nitride material on a physically exposed surface of the tunneling dielectric layer and on the chemical oxide layer; and forming a vertical semiconductor channel by depositing a continuous semiconductor material layer on the underlying semiconductor material portion and the tunneling dielectric layer and on the silicon nitride ring.

BRIEF DESCRIPTION OF THE DRAWINGS

FIG. 9B is a partial see-through top-down view of the exemplary structure of FIG. 9A. The vertical plane A-A' is the plane of the schematic vertical cross-sectional view of FIG. 9A.

FIGS. 11A-11D are sequential vertical cross-sectional views of a region of the exemplary structure during formation of electrically conductive layers according to an embodiment of the present disclosure.

FIG. 14B is a magnified view of a region of the exemplary structure of FIG. 14A.

FIG. 15B is a top-down view of the exemplary structure of FIG. 15A. The vertical plane A-A' is the plane of the schematic vertical cross-sectional view of FIG. 15A.

DETAILED DESCRIPTION

Figure 1:
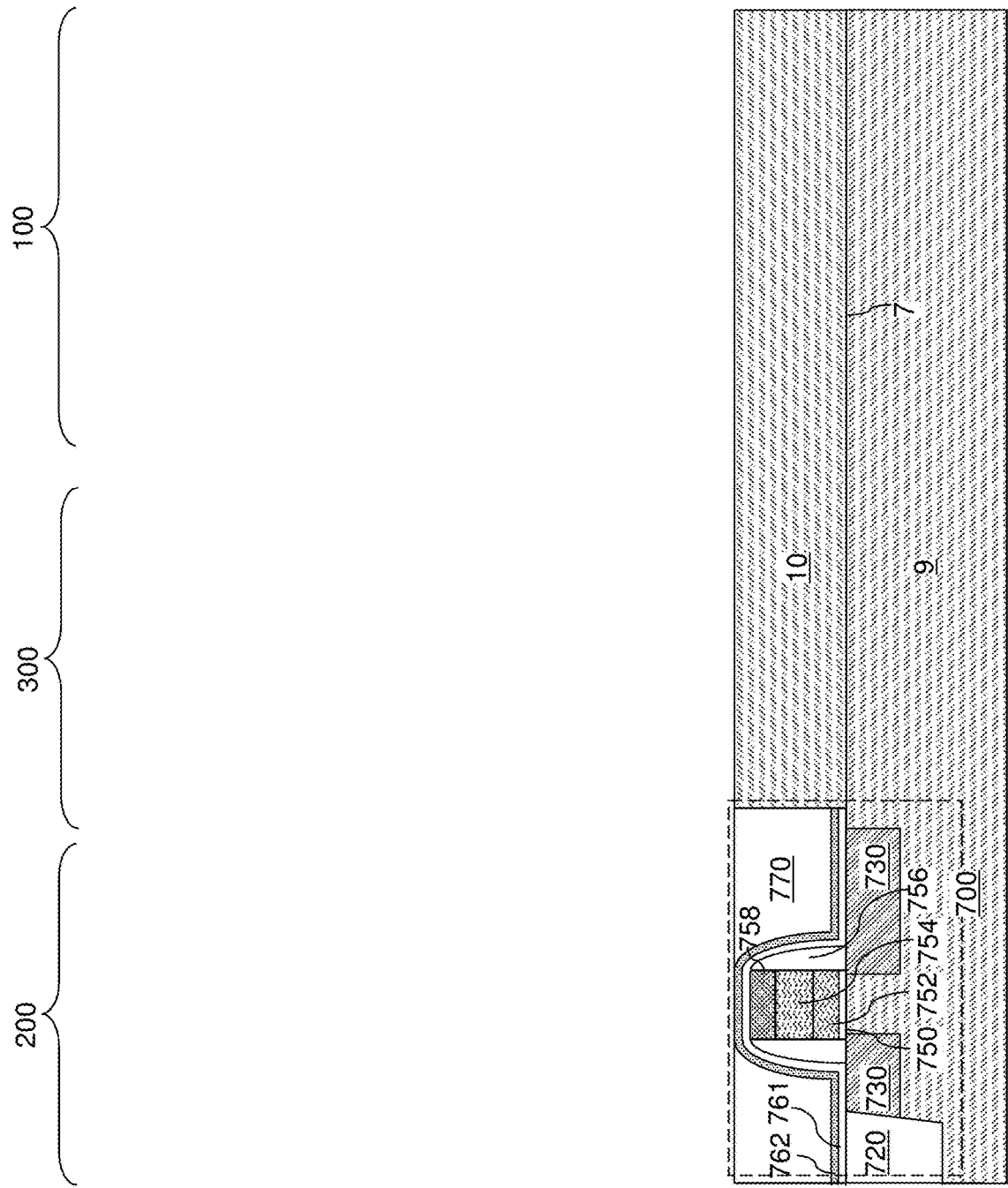
FIG. 1 is a schematic vertical cross-sectional view of an exemplary structure after formation of at least one peripheral device and a semiconductor material layer according to an embodiment of the present disclosure.

As discussed above, the present disclosure is directed to a three-dimensional memory device including a silicon nitride ring around an opening in a memory film for providing a uniform-thickness vertical semiconductor channel therethrough and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

The substrate semiconductor layer 9 can be a single crystalline substrate semiconductor material layer including a single crystalline substrate semiconductor material. In other words, the entirety of the substrate semiconductor layer 9 can be single crystalline. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

At least one semiconductor device 700 for a peripheral circuitry may optionally be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by doping (e.g., ion implantation or diffusion) or by deposition of a single crystalline semiconductor material, for example, by selective epitaxy. The optional semiconductor material layer 10, if present, may be a doped well in the substrate semiconductor layer 9 or it may be a single crystalline layer (e.g., single crystal silicon layer) that is deposited on and is in epitaxial alignment with the single crystalline substrate semiconductor material of the substrate semiconductor layer 9. The material of the semiconductor material layer 10 may be the same as, or can be different from, the semiconductor material of the substrate semiconductor layer 9. If the semiconductor material layer 10 is deposited on the substrate semiconductor layer 9, then portions of the deposited semiconductor material layer 10 located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In an alternative embodiment, the peripheral device region 200 containing the at least one semiconductor device 700 is not formed on the same substrate (9, 10) as the memory array region 100. Instead, the peripheral device region 200 containing the at least one semiconductor device 700 is formed on a separate substrate and is then bonded to the substrate (9, 10) containing the memory array region 100.

Figure 2:
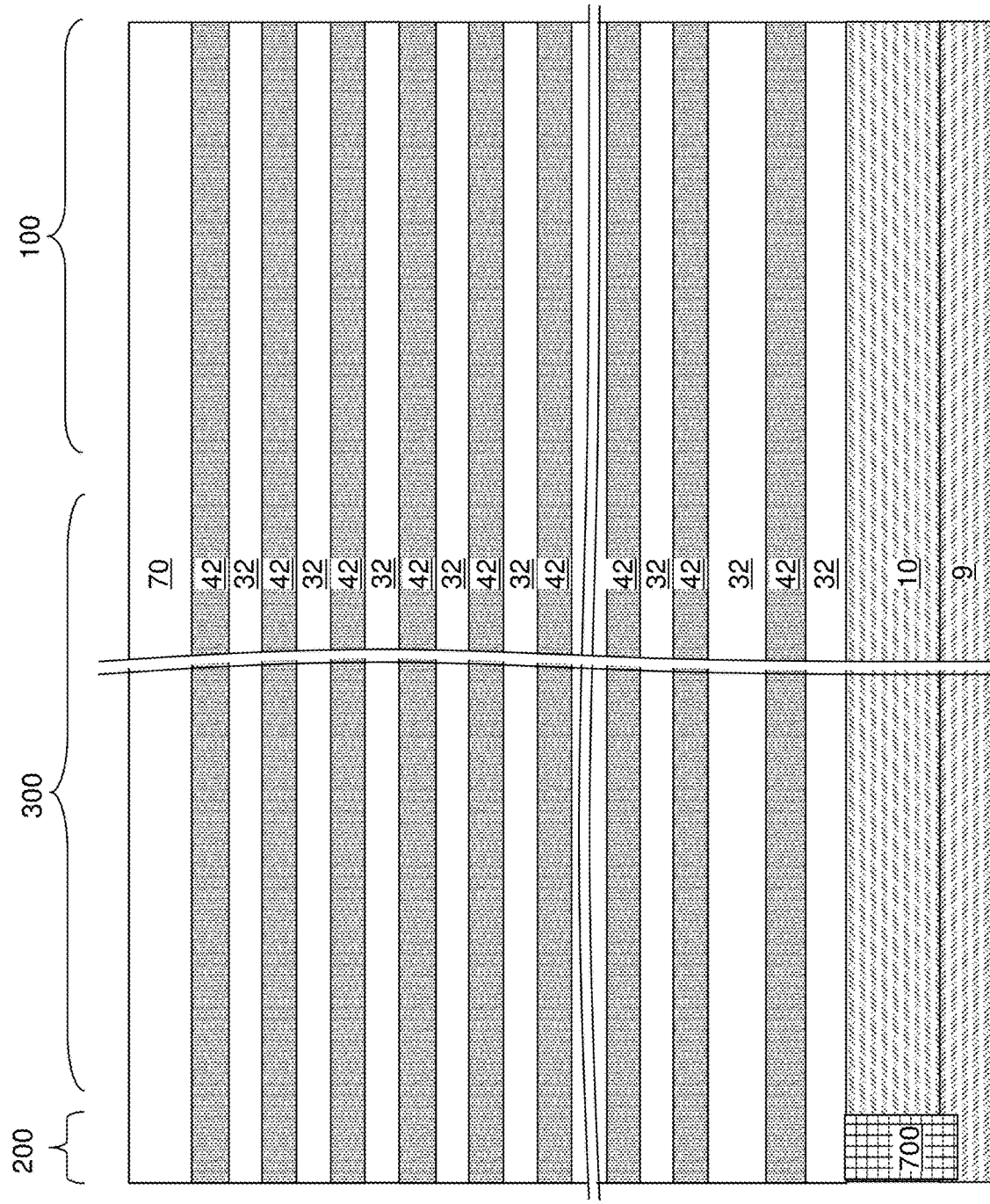
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
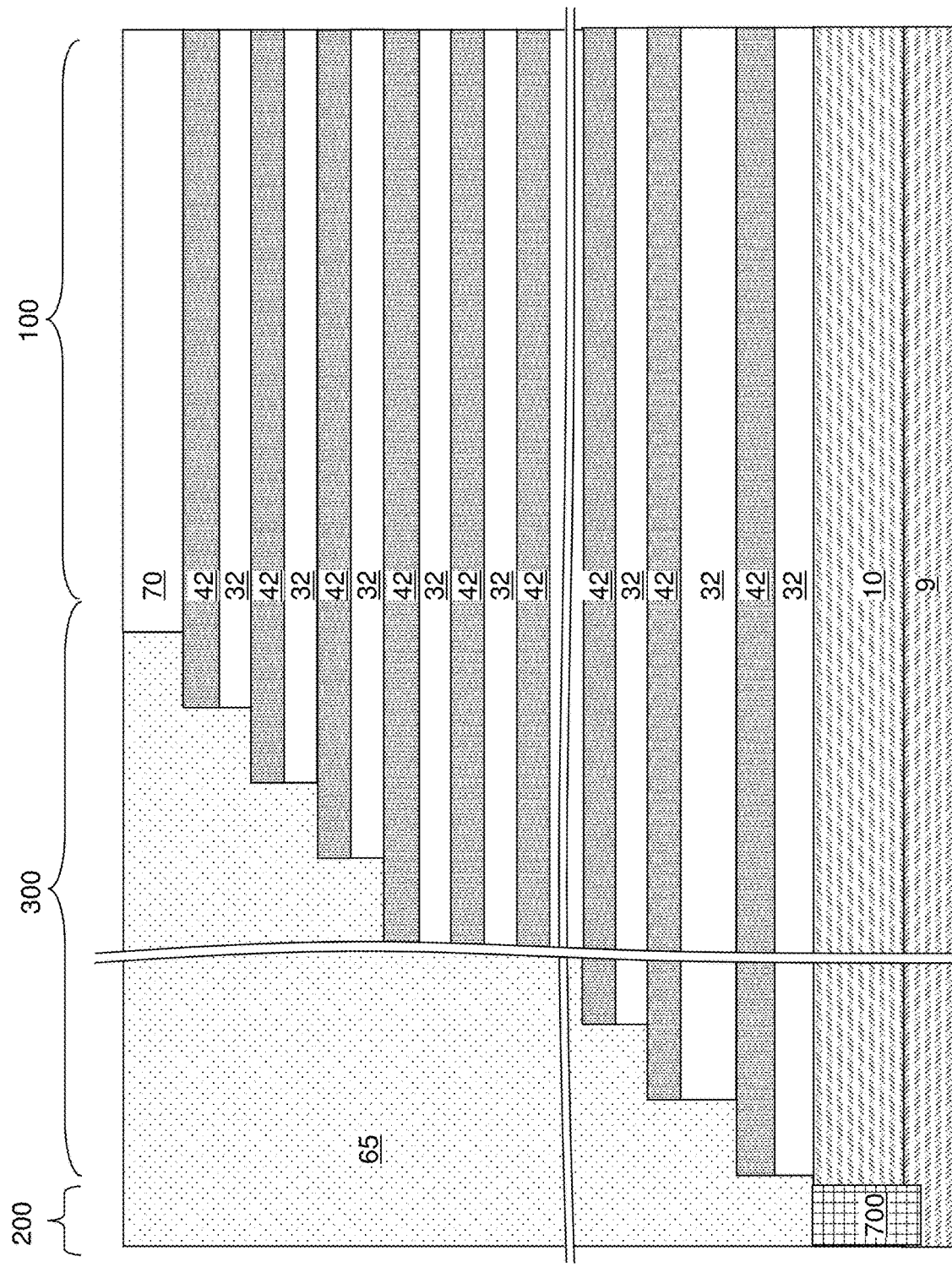
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
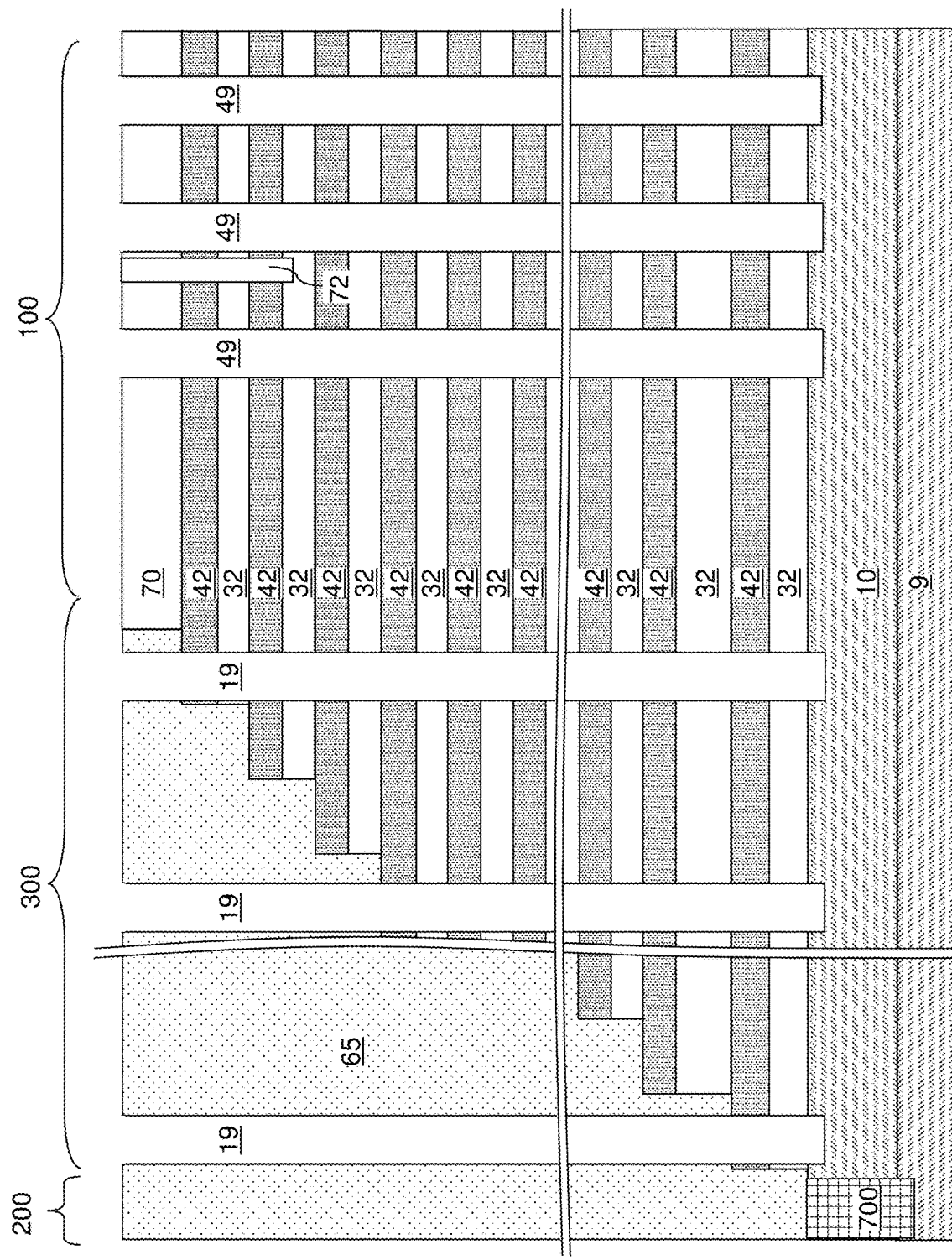
FIG. 4A is a schematic vertical cross-sectional view of the exemplary structure after formation of memory openings and support openings according to an embodiment of the present disclosure.
Figure 4B:
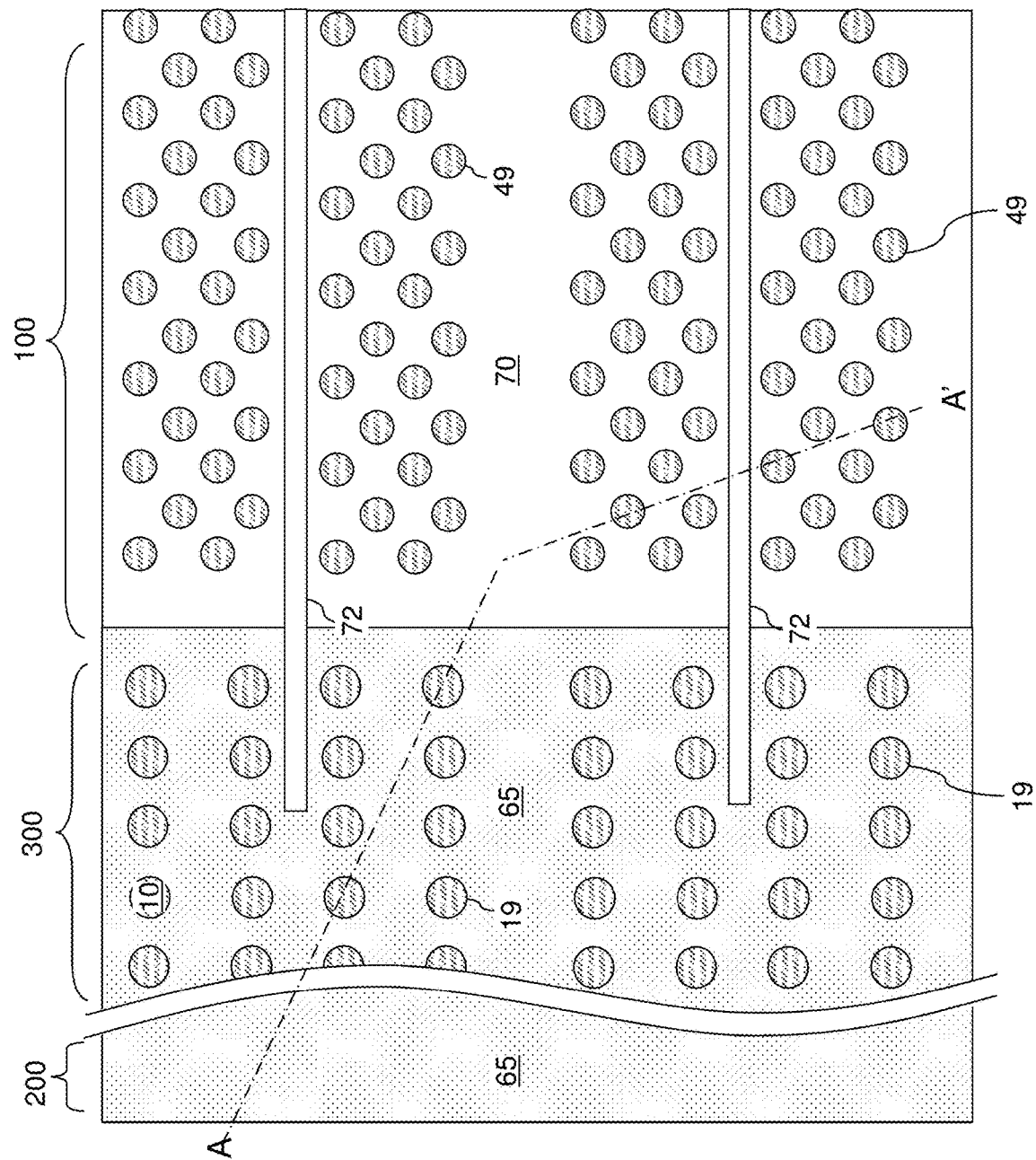
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5N illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

An epitaxial pedestal structure 11 can be formed at the bottom portion of each memory opening 49 and each support openings 19, for example, by selective epitaxy. The epitaxial pedestal structure 11 can be formed by epitaxial growth of a single crystalline semiconductor material (which is herein referred to as a single crystalline pedestal semiconductor material) at a bottom portion of each memory opening 49 and at a bottom portion of each support opening 19. In one embodiment, the top surface of each epitaxial pedestal structure 11 can be formed above a horizontal plane including the top surface of a bottommost sacrificial material layer 42. In this case, a source select gate electrode can be subsequently formed by replacing the bottommost sacrificial material layer 42 with a conductive material layer. The epitaxial pedestal structure 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the epitaxial pedestal structure 11. In one embodiment, the epitaxial pedestal structure 11 can comprise single crystalline silicon. In one embodiment, the epitaxial pedestal structure 11 can have a doping of the first conductivity type, which is the same as the conductivity type of the semiconductor material layer 10 that the epitaxial pedestal structure contacts. If a semiconductor material layer 10 is not present, the epitaxial pedestal structure 11 can be formed directly on the substrate semiconductor layer 9, which can have a doping of the first conductivity type. Thus, each epitaxial pedestal structure 11 comprises a single crystalline semiconductor material (e.g., single crystal silicon) in epitaxial alignment with the single crystalline semiconductor material (e.g., single crystal silicon) of the semiconductor material layer 10 (if present) or of the substrate semiconductor layer 9. In one embodiment, the epitaxial pedestal structure 11 can have a doping of the first conductivity type (e.g., p-type conductivity). The atomic concentration of dopants of the first conductivity type in the epitaxial pedestal structures 11 can be in a range from $1.0 \times 10^{14}/cm^3$ to $3.0 \times 10^{17}/cm^3$, although lesser and greater atomic concentrations can also be employed. The height of the epitaxial pedestal structure 11 can be in a range from 40 nm to 200 nm, although lesser and greater heights can also be employed.

Referring to FIG. 5B, a stack of layers including a blocking dielectric layer 52, a silicon nitride layer 54, a tunneling dielectric layer 56, and a cover semiconductor material layer 601 can be sequentially deposited in the memory openings 49.

The blocking dielectric layer 52 can include silicon oxide. The blocking dielectric layer 52 can be formed by a conformal deposition process such as a chemical vapor deposition process. The thickness of the dielectric semiconductor compound can be in a range from 1 nm to 20 nm, although lesser and greater thicknesses can also be employed.

Subsequently, the silicon nitride layer 54 can be formed. The silicon nitride layer 54 can consist essentially of silicon nitride. The silicon nitride layer 54 can be formed by a conformal deposition process such as a low pressure chemical vapor deposition process. A silicon precursor gas such as dichlorosilane ($SiH_2Cl_2$) and a nitrogen precursor gas such as ammonia can be flowed into a process chamber, in which the silicon precursor gas and the nitrogen precursor gas decompose and combine to form stoichiometric silicon nitride. The deposition temperature can be in a range from 750 degrees Celsius to 825 degrees Celsius. The thickness of the silicon nitride layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The cover semiconductor material layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the cover semiconductor material layer 601 includes amorphous silicon or polysilicon. The cover semiconductor material layer 601 can be formed by a conformal deposition method such as low pressure chemical vapor deposition (LPCVD). The thickness of the cover semiconductor material layer 601 can be in a range from 2 nm to 10 nm, although lesser and greater thicknesses can also be employed.

Referring to FIG. 5C, the cover semiconductor material layer 601, the tunneling dielectric layer 56, the silicon nitride layer 54, and the blocking dielectric layer 52 are sequentially anisotropically etched employing at least one anisotropic etch process. The portions of the cover semiconductor material layer 601, the tunneling dielectric layer 56, the silicon nitride layer 54, and the blocking dielectric layer 52 located above the top surface of the insulating cap layer 70 can be removed by the at least one anisotropic etch process. Further, the horizontal portions of the cover semiconductor material layer 601, the tunneling dielectric layer 56, the silicon nitride layer 54, and the blocking dielectric layer 52 at a bottom of each memory cavity 49' can be removed to form openings through remaining portions thereof. Each of the cover semiconductor material layer 601, the tunneling dielectric layer 56, the silicon nitride layer 54, and the blocking dielectric layer 52 can be etched by a respective anisotropic etch process employing a respective etch chemistry, which may, or may not, be the same for the various material layers. Center portions of each epitaxial pedestal structure 11 can be recessed to provide a recessed top surface and an inner cylindrical sidewall that adjoins the recessed top surface to an unrecessed annular surface of the respective epitaxial pedestal structure 11.

Each remaining portion of the cover semiconductor material layer 601 can have a tubular configuration. The silicon nitride layer 54 can comprise a charge trapping material or a floating gate material. In one embodiment, each silicon nitride layer 54 can include a vertical stack of charge storage regions that store electrical charges upon programming. In one embodiment, the silicon nitride layer 54 can be a charge storage layer in which each portion adjacent to the sacrificial material layers 42 constitutes a charge storage region.

A surface of the epitaxial pedestal structure 11 (or a surface of the semiconductor material layer 10 in case the epitaxial pedestal structures 11 are not employed) can be physically exposed underneath the opening through the cover semiconductor material layer 601, the tunneling dielectric layer 56, the silicon nitride layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost annular surface of the epitaxial pedestal structure 11 (or of the semiconductor material layer 10 in case epitaxial pedestal structures 11 are not employed) by a recess distance. A tunneling dielectric layer 56 is located over the silicon nitride layer 54. A set of a blocking dielectric layer 52, a silicon nitride layer 54, and a tunneling dielectric layer 56 in a memory opening 49 constitutes a memory film 50, which includes a plurality of charge storage regions (comprising the silicon nitride layer 54) that are insulated from surrounding materials by the blocking dielectric layer 52 and the tunneling dielectric layer 56. In one embodiment, the cover semiconductor material layer 601, the tunneling dielectric layer 56, the silicon nitride layer 54, and the blocking dielectric layer 52 can have vertically coincident sidewalls.

A memory film 50 is formed in each memory opening 49. The memory film includes an opening at a bottom portion thereof. A surface of an underlying semiconductor material portion (such as the surface of an underlying epitaxial pedestal structure 11) is physically exposed at a bottom of the opening. Each of the memory films 50 comprises a layer stack that includes a silicon nitride layer 54 containing a respective vertical stack of memory elements, and a tunneling dielectric layer 56 contacting an inner sidewall of the silicon nitride layer 54. The memory elements can be portions of the silicon nitride layer 54 located at the levels of the sacrificial material layers 42, which are subsequently replaced with electrically conductive layers 46.

An opening is present at a bottom portion of the memory film 50. Sidewalls of the tunneling dielectric layer 56, the silicon nitride layer 54, and the blocking dielectric layer 52 are physically exposed around the opening through the memory film 50. In case the tunneling dielectric layer 56 includes a silicon oxide layer, the physically exposed sidewall of the tunneling dielectric layer 56 includes a silicon oxide surface. A surface of an underlying semiconductor material portion is physically exposed at a bottom of the opening in the memory film 50. In one embodiment, the underlying semiconductor material portion can include an epitaxial pedestal structure 11 containing a single crystalline semiconductor material.

Referring to FIG. 5D, an optional surface oxidation process may be performed. For example, thermal oxidation, plasma oxidation, or wet oxidation may be performed to convert surfaces portions of the cover semiconductor material layer 601 and surface portions of the epitaxial pedestal structure 11 into semiconductor oxide layers. Specifically, surface portions of the cover semiconductor material layer 601 can be converted into a first surface semiconductor oxide layer 157, and surface portions of the epitaxial pedestal structure 11 can be converted into a second surface semiconductor oxide layer 357 by the oxidation process. The thickness of the first surface semiconductor oxide layer 157 and the second surface semiconductor oxide layer 357 can be in a range from 1 nm to 3 nm, although lesser and greater thicknesses can also be employed. The oxidation may also repair damage caused by the reactive ion etching step shown in FIG. 5C.

Referring to FIG. 5E, an isotropic silicon oxide etch process that etches silicon oxide selective to silicon nitride can be performed. The isotropic silicon oxide etch process can include a wet etch process that employs dilute hydrofluoric acid. For example, a wet etch process employing 100:1 dilute hydrofluoric acid can be performed to remove silicon oxide materials of the tunneling dielectric layer 56, the blocking dielectric layer 52, the first surface semiconductor oxide layer 157, and the second surface semiconductor oxide layer 357. The first surface semiconductor oxide layer 157 and the second surface semiconductor oxide layer 357 can be entirely removed. The tunneling dielectric layer 56 and the blocking dielectric layer 52 are laterally recessed around the opening through the horizontal portion of the memory film 50 that is proximal to the epitaxial pedestal structure 11.

In one embodiment, the selectivity of the isotropic silicon oxide etch process to silicon nitride can be greater than 10, and may be greater than 50. In other words, the etch rate of the silicon oxide materials of the blocking dielectric layer 52 and the tunneling dielectric layer 56 can be at least 10 times, and/or at least 50 times, the etch rate of the silicon nitride material of the silicon nitride layer 54 during the isotropic silicon oxide etch process. Sidewalls of the blocking dielectric layer 52 and the tunneling dielectric layer 56 are recessed outward relative to the sidewall of the silicon nitride layer 54. The lateral recess distance between the sidewalls of the blocking dielectric layer 52 and the tunneling dielectric layer 56 and the sidewall of the silicon nitride layer 54 can be in a range from 1 nm to 10 nm, such as from 2 nm to 6 nm, although lesser and greater lateral recess distances can also be employed.

Physically exposed surfaces of the silicon nitride layer 54 can include an annular upper surface 54U of a horizontal portion of the silicon nitride layer 54 that surrounds the opening through the memory film 50, an annular lower surface 54L of the horizontal portion of the silicon nitride layer 54, and a vertical cylindrical tip surface 54T adjoining and connecting the upper surface 54U to the lower surface 54L.

Referring to FIG. 5F, a chemical oxidation process can be performed by subjecting the semiconductor surfaces of the epitaxial pedestal structure 11 and the cover semiconductor material layer 601 to an oxidizing chemical solution. For example, a trimethyl-2 hydroxyethyl ammonium hydroxide ("TMY") solution can be applied to the physically exposed surfaces of the epitaxial pedestal structure 11 and the cover semiconductor material layer 601 at room temperature. The TMY solution can be dried employing isopropyl alcohol ("IPA") vapor to form a thin layer of chemical oxide on the physically exposed surfaces of the epitaxial pedestal structure 11 and the cover semiconductor material layer 601. As used herein, a "chemical oxide" refers to a semiconductor oxide that is grown on a semiconductor surface during wet cleaning and rinsing operations. A chemical oxide is highly hydrated, and has a non-stoichiometric composition in which the atomic percentage of oxygen atoms is less than the atomic percentage of oxygen atoms in a stoichiometric semiconductor oxide. Specifically, a first chemical oxide layer 317 can be formed on the physically exposed surfaces of the epitaxial pedestal structure 11, and a second chemical oxide layer 117 can be formed on the physically exposed surfaces of the cover semiconductor material layer 601.

Each of the first chemical oxide layer 317 and the second chemical oxide layer 117 is a surface oxide layer having a composition of $SiO_x$, in which x is in a range from 1 to 1.9. In other words, the first chemical oxide layer 317 and the second chemical oxide layer 117 is non-stoichiometric, and includes oxygen atoms attached to a surface layer of silicon atoms on the surfaces of the epitaxial pedestal structure 11 and the cover semiconductor material layer 601. In one embodiment, each of the first chemical oxide layer 317 and the second chemical oxide layer 117 can include a chemical oxide layer having a thickness in a range from 0.3 nm to 0.7 nm.

Referring to FIG. 5G, a selective silicon nitride deposition process is performed to grow a silicon nitride ring 454 from physically exposed surfaces of the silicon nitride layer 54 around the opening through the memory film 50. A silicon nitride material is selectively grown from the physically exposed surfaces (54U, 54T, 54L) of the silicon nitride layer 54. Specifically, the silicon nitride material grows only from the physically exposed surfaces of the silicon nitride layer 54, and does not grow from silicon oxide surfaces of the first chemical oxide layer 317, the second chemical oxide layer 117, the blocking dielectric layer 52, the tunneling dielectric layer 56, and the insulating cap layer 70.

The selective growth of the silicon nitride material for formation of the silicon nitride ring 454 can be performed by a chemical vapor deposition process. Nucleation of silicon nitride proceeds on the physically exposed surfaces (54U, 54T, 54L) of an annular silicon nitride layer portion of the silicon nitride layer 54, while nucleation of silicon nitride on the silicon oxide surfaces (such as the blocking dielectric layer 52, the tunneling dielectric layer 56, and the insulating cap layer 70) and on the chemical oxide layers (such as the first chemical oxide layer 317 and the second chemical oxide layer 117) is suppressed.

The chemical vapor deposition process that deposits silicon nitride can comprise a low pressure chemical vapor deposition process employing a silicon precursor gas and a nitrogen precursor gas. The silicon precursor gas can include dichlorosilane ($SiH_2Cl_2$) or silane ($SiH_4$), and the nitrogen precursor gas can include ammonia ($NH_3$). The combined partial pressure of the silicon precursor gas and the nitrogen precursor gas during the low pressure chemical vapor deposition process can be in a range from 10 mTorr to 1 Torr, such as from 30 mTorr to 300 mTorr. The deposition temperature during the low pressure chemical vapor deposition process can be in a range from 750 degrees Celsius to 825 degrees Celsius, although lower and higher temperatures can also be employed. Silicon nitride can be deposited on various dielectric surfaces with different incubation times.

According to an aspect of the present disclosure, a difference between the incubation time of silicon nitride on a silicon nitride surface and the incubation time of silicon nitride on a silicon oxide surface is employed to induce selective deposition of silicon nitride only on silicon nitride surfaces while suppressing deposition of silicon nitride on silicon oxide surfaces. Specifically, the duration of the low pressure chemical vapor deposition process can be selected such that the deposition time during the low pressure chemical vapor deposition process is less than the incubation time of silicon nitride on silicon oxide surfaces, and is greater than the incubation time of silicon nitride on silicon nitride surfaces.

In an alternative embodiment, an silicon nitride deposition inhibitor may be selectively formed on exposed silicon oxide surfaces to selectively deposit the silicon nitride ring 454 on the exposed silicon nitride surfaces (54U, 54T, 54L). In one embodiment, the silicon nitride deposition inhibitor may be a self-assembled monolayer (SAM) of an organic material that selectively forms on exposed silicon oxide surfaces, such as the recessed edge surfaces of the blocking dielectric layer 52 and the tunneling dielectric layer 56 in the opening of the memory film 50, but does not form on the exposed surfaces (54U, 54T, 54L) of the silicon nitride charge storage layer 54 in the same opening. For example, fluorine or aminosilane SAMs may be used as the silicon nitride deposition inhibitor such that the silicon nitride ring 454 is selectively grown on the exposed surfaces (54U, 54T, 54L) of the silicon nitride charge storage layer 54, but not on the SAM covered silicon oxide surfaces.

Referring back to FIG. 5G, the duration of the deposition step in the selective silicon nitride deposition process can be selected such that the thickness of the silicon nitride ring 454 along each growth direction is greater than the thickness of the blocking dielectric layer 52, and is greater than the thickness of the tunneling dielectric layer 56, provided that the duration of the deposition step is less than the incubation time for silicon nitride on a silicon oxide surface.

Referring to FIG. 5H, the first chemical oxide layer 317 and the second chemical oxide layer 117 can be removed selective to the silicon nitride ring 454 by a first isotropic etch process. For example, a wet etch process employing 100:1 dilute hydrofluoric acid can be performed to remove the first chemical oxide layer 317 and the second chemical oxide layer 117.

Subsequently, the cover semiconductor material layer 601 can be removed selective to the tunneling dielectric layer 56 and the silicon nitride ring 454 by performing a second isotropic etch process. For example, if the cover semiconductor material layer 601 includes amorphous silicon, a wet etch process employing hot trimethyl-2 hydroxyethyl ammonium hydroxide ("hot TMY") or tetramethyl ammonium hydroxide (TMAH) may be used to remove the cover semiconductor material layer 601 selective to the materials of the tunneling dielectric layer 56 and the silicon nitride ring 454.

Referring to FIG. 5I, an amorphous semiconductor channel material layer 602 can be non-selectively deposited directly on the physically exposed semiconductor surfaces of an underlying semiconductor material portion (such as the epitaxial pedestal structure 11), the physically exposed surfaces of the silicon nitride ring 454, and the physically exposed surfaces of the tunneling dielectric layer 56. As used herein, a "semiconductor channel material" refers to a semiconductor material that is employed to form a semiconductor channel of a field effect transistor. The semiconductor channel material in the amorphous semiconductor channel material layer 602 is deposited as an amorphous semiconductor material by selecting a deposition temperature which prevents crystallization of the deposited semiconductor channel material. The amorphous semiconductor channel material layer 602 includes an amorphous semiconductor material such as at least one elemental semiconductor material, at least one III-V compound semiconductor material, at least one II-VI compound semiconductor material, at least one organic semiconductor material, or other semiconductor materials known in the art. In one embodiment, the amorphous semiconductor channel material layer 602 includes amorphous silicon.

The amorphous semiconductor channel material layer 602 can be formed as a continuous semiconductor channel material layer by performing a chemical vapor deposition process. The duration of the deposition step of the chemical vapor deposition process is greater than the incubation times of the various physically exposed surfaces of the exemplary structure. For example, the amorphous semiconductor channel material layer 602 can be formed by a conformal deposition method such as low pressure chemical vapor deposition (LPCVD). For example, if low pressure chemical vapor deposition process employing silane as a precursor gas is employed to deposit amorphous silicon, deposition temperature less than 570 degrees Celsius can be employed to deposit the semiconductor channel material in an amorphous state.

The thickness of the amorphous semiconductor channel material layer 602 can be in a range from 5 nm to 30 nm, such as 10 nm to 20 nm, although lesser and greater thicknesses can also be employed. In one embodiment, amorphous silicon can be deposited with a greater incubation time on the tunneling dielectric layer 56 than on the silicon nitride ring 54 during the chemical vapor deposition process. In this case, the lateral thickness of a portion of the amorphous semiconductor channel material layer 602 contacting an inner sidewall of the silicon nitride ring 454 can be greater than the lateral thickness of a portion of the amorphous semiconductor channel material layer 602 contacting an inner sidewall of the tunneling dielectric layer 56.

Figure 7:
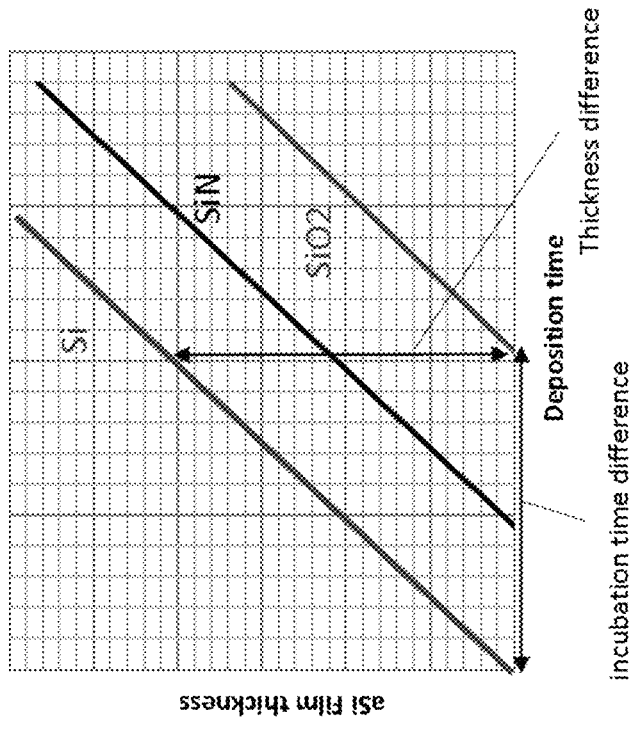
FIGS. 6 and 7 illustrate dependence of the incubation time for deposition of amorphous silicon on various underlying surfaces with different surface treatments.
Figure 6:
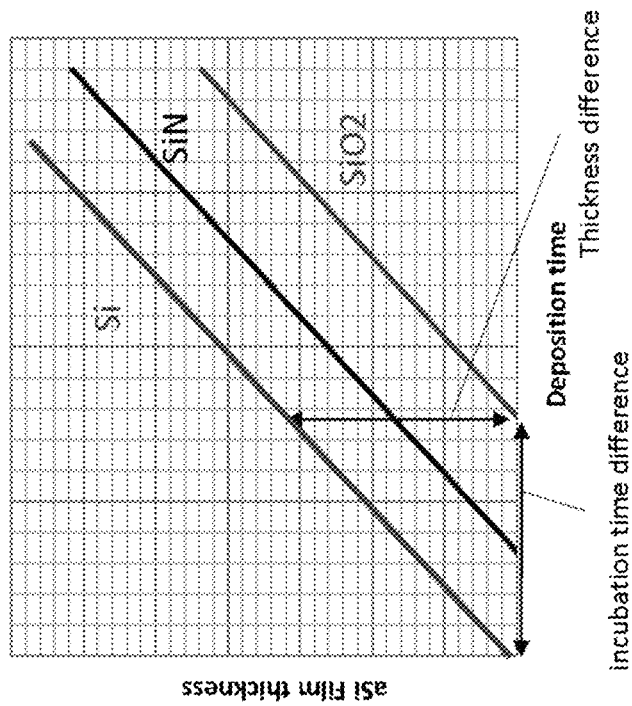

Generally speaking, the incubation time for deposition of a material on an underlying surface is function of the composition of the deposited material, the composition of the underlying surface, and a surface treatment performed on the underlying surface that is performed prior to the deposition process. Referring to FIGS. 6 and 7, the dependence of the incubation time for deposition of amorphous silicon on various underlying surfaces with different surface preparation processes is illustrated. For the purpose of deposition of amorphous silicon, the incubation time on a silicon surface is effectively zero, and the incubation time on a silicon nitride surface is shorter than the incubation time on a silicon oxide surface. The difference among the incubation times can be increased by performing a pre-clean and silylation process on the underlying surfaces.

An exemplary pre-clean process can include a wet etch process employing a dilute hydrofluoric acid (DHF) that induces silylation of physically exposed surfaces, and a drying process employing isopropyl alcohol (IPA) vapor. As shown in FIG. 7, the DHF/silylation/IPA process increases the difference in incubation time of amorphous silicon deposition on exposed silicon oxide surfaces compared to exposed silicon and silicon nitride surfaces. Therefore, a thicker, smoother, more uniform amorphous silicon layer may be deposited on the exposed silicon and silicon nitride surfaces following the DHF/silylation/TMY/IPA process, as shown in FIG. 7 than if the DHF/silylation/IPA process is omitted, as shown in FIG. 6.

Furthermore, the likelihood that the amorphous silicon layer will be discontinuous in the opening in the memory film 50 is decreased by forming the silicon nitride ring 454 which covers the exposed silicon oxide surfaces of the blocking dielectric layer 52 and the tunneling dielectric layer 56 on which amorphous silicon incubation time is longer (which leads to a delay in deposition of amorphous silicon on these surfaces) than on exposed silicon nitride and silicon surfaces.

The amorphous semiconductor channel material layer 602 may partially fill the memory cavity 49' in each memory opening, or may fully fill the cavity in each memory opening. The amorphous semiconductor channel material layer 602 can have a doping of the first conductivity type. The atomic concentration of dopants of the first conductivity type in the amorphous semiconductor channel material layer 602 can be in a range from $1.0 \times 10^{14}/cm^3$ to $3.0 \times 10^{17}/cm^3$, although lesser and greater atomic concentrations can also be employed.

Referring to FIG. 5J, an anneal process can be performed to covert the amorphous semiconductor channel material in the amorphous semiconductor channel material layer 602 into crystalline material portions to form a continuous polycrystalline semiconductor channel material layer 60P. The entirety of the continuous polycrystalline semiconductor channel material layer 60P can be polycrystalline, such as polysilicon.

Figure 5K:
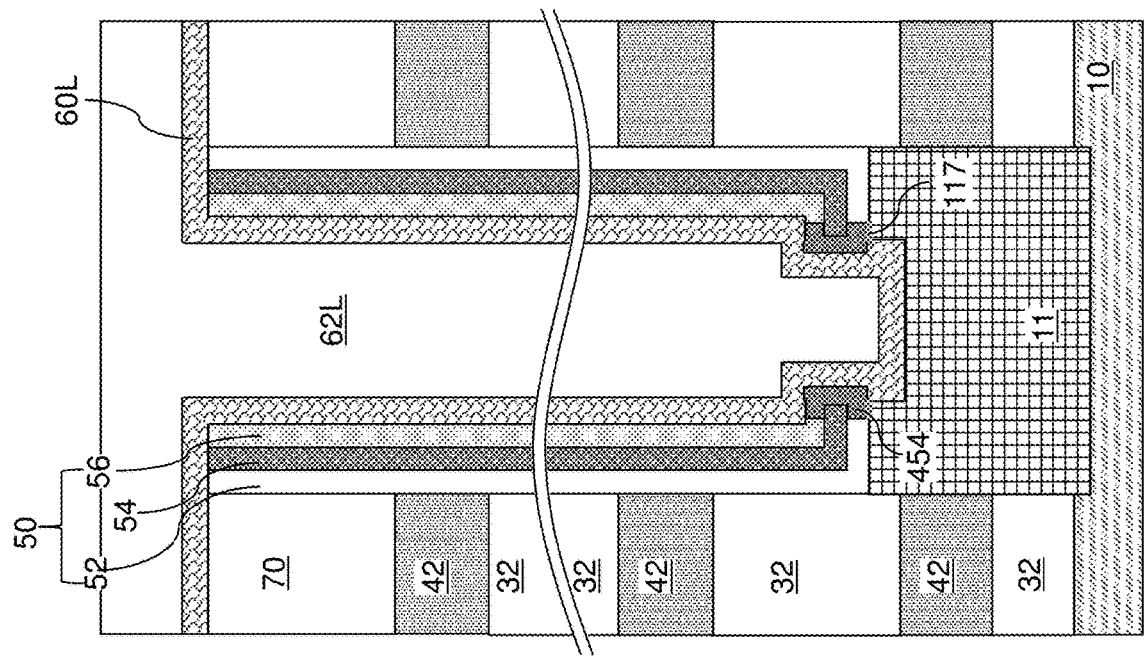
FIGS. 5A-5N are sequential schematic vertical cross-sectional views of a memory opening during formation of a memory opening fill structure therein according to an embodiment of the present disclosure.

Referring to FIG. 5K, the continuous polycrystalline semiconductor channel material layer 60P can be isotropically thinned to provide vertical semiconductor channels having a target lateral thickness. For example, a wet etch process employing hot trimethyl-2 hydroxyethyl ammonium hydroxide ("hot TMY"), tetramethyl ammonium hydroxide (TMAH), or ammonium hydroxide may be used to thin the continuous polycrystalline semiconductor channel material layer 60P. The target lateral thickness of the remaining vertical portions of the continuous polycrystalline semiconductor channel material layer 60P can be in a range from 3 nm to 30 nm, such as from 6 nm to 15 nm, although lesser and greater target lateral thicknesses can also be employed. The remaining continuous material layer formed by thinning of the continuous polycrystalline semiconductor channel material layer 60P is herein referred to as a polycrystalline semiconductor channel material layer 60L, or a thinned polycrystalline semiconductor channel material layer.

Figure 5L:
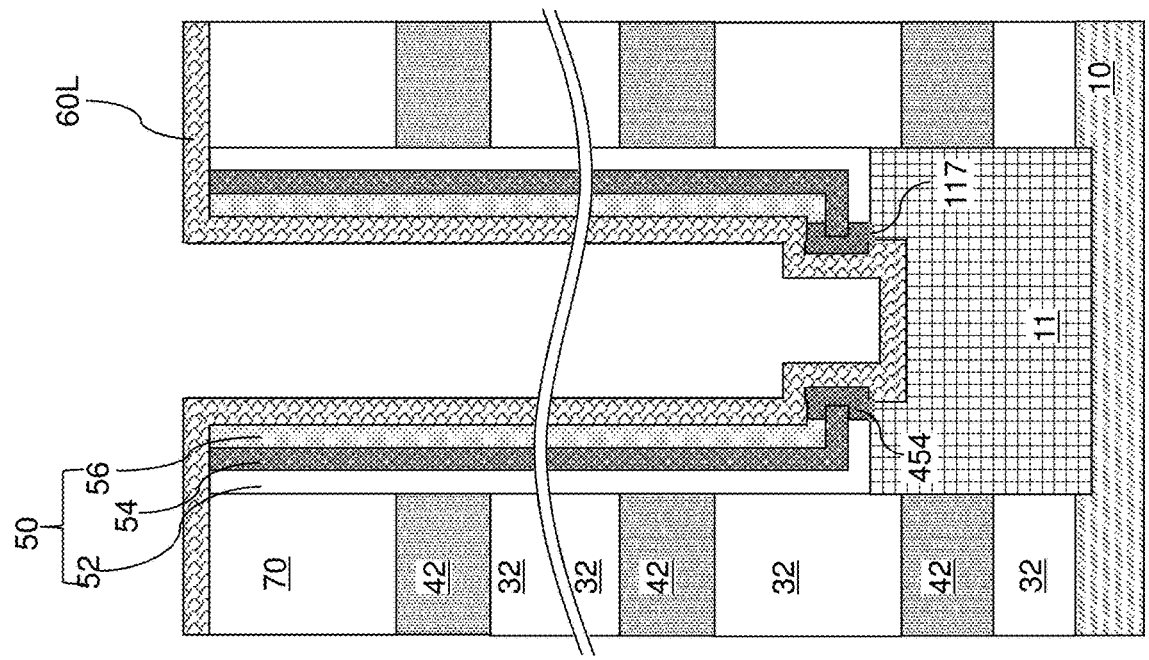

Referring to FIG. 5L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5M, portions of the dielectric core layer 62L can be removed, for example, by a recess etch that etches the material of the dielectric core layer 62L selective to the material of the polycrystalline semiconductor channel material layer 60L. An isotropic etch process such as a wet etch process or an anisotropic etch process such as a reactive ion etch process may be employed. The dielectric material of the dielectric core layer 62L can be recessed such that the top surface of each remaining portion of the dielectric core layer 62L is formed between the horizontal plane including the top surface of the insulating cap layer 70 and the horizontal plane including the bottom surface of the insulating cap layer 70. Each remaining portion of the dielectric core layer 62L constitutes a dielectric core 62.

Further, the horizontal portion of the polycrystalline semiconductor channel material layer 60L located above the top surface of the insulating cap layer 70 can be removed by an anisotropic etch process such as a reactive ion etch process. Each remaining cylindrical portion of the polycrystalline semiconductor channel material layer 60L constitutes a vertical semiconductor channel 60, which can consist of a polycrystalline semiconductor material. Each vertical semiconductor channel 60 is formed on an inner sidewall of a respective memory film 50. Each vertical semiconductor channel 60 can be located entirety within a memory opening 49 or entirely within a support opening 19. Each dielectric core 62 is located directly on a respective vertical semiconductor channel 60.

As discussed above, the incubation time for deposition of amorphous silicon on a silicon nitride surface (such as a physically exposed surface of the silicon nitride ring 454) can be shorter than the incubation time for deposition of amorphous silicon on a silicon oxide surface (such as a surface of the tunneling dielectric layer 56) as illustrated in FIGS. 6 and 7. In this case, the lateral thickness of a portion of the vertical semiconductor channel 60 contacting an inner sidewall of the silicon nitride ring 454 can be greater than the lateral thickness of a portion of the vertical semiconductor channel 60 contacting an inner sidewall of the tunneling dielectric layer 56.

A tunneling dielectric layer 56 is surrounded by a silicon nitride layer 54, and laterally surrounds a portion of the vertical semiconductor channel 60. Each adjoining set of a blocking dielectric layer 52, a silicon nitride layer 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours. A silicon nitride ring 454 laterally surrounds a neck portion of the vertical semiconductor channel 60 that extends through an opening in the memory film 50.

Referring to FIG. 5N, drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. The entirety of each drain region 63 can be polycrystalline. Each drain region 63 is formed at upper end of a respective vertical semiconductor channel 60.

Each combination of a memory film 50 and a vertical semiconductor channel 60 within a memory opening 49 constitutes a memory stack structure 55. The memory stack structure 55 comprises a combination of a vertical semiconductor channel 60, a tunneling dielectric layer 56, a plurality of memory elements comprising portions of the silicon nitride layer 54, and a blocking dielectric layer 52. Each combination of an epitaxial pedestal structure 11, a memory stack structure 55, a silicon nitride ring 454, a dielectric core 62, and a drain region 63 within a memory opening 49 is herein referred to as a memory opening fill structure 58. Each combination of an epitaxial pedestal structure 11, a memory stack structure 55, a silicon nitride ring 454, a dielectric core 62, and a drain region 63 within each support opening 19 fills the respective support openings 19, and constitutes a support pillar structure.

Within each memory opening fill structure 58, the silicon nitride ring 454 contacts a sidewall of the opening in the memory film 50. A vertical semiconductor channel 60 contacts an inner sidewall of a vertically-extending portion of the memory film 50, and extends through the silicon nitride ring 454, and contacts a semiconductor material portion that underlies the memory film 50 (such as the epitaxial pedestal structure 11) and the silicon nitride ring 454. The silicon nitride ring 454 vertically extends from a top surface of the semiconductor material portion (such as the epitaxial pedestal structure 11) to a periphery of an interface between the tunneling dielectric layer 56 and the vertical semiconductor channel 60.

In one embodiment, the silicon nitride layer 54 comprises an annular silicon nitride layer portion (i.e., a horizontally-extending portion having an annular shape of the silicon nitride layer 54) through which the opening at the bottom portion of the memory film 50 extends. The tunneling dielectric layer 56 comprises an annular tunneling dielectric layer portion (i.e., a horizontally-extending portion having an annular shape of the tunneling dielectric layer 56) through which the opening at the bottom portion of the memory film 50 extends.

In one embodiment, the silicon nitride ring 454 contacts a cylindrical sidewall 54T of the annular silicon nitride layer portion 54, an upper surface 54L of the annular silicon nitride layer portion, and a lower surface 54L of the annular silicon nitride layer portion. In one embodiment, the silicon nitride ring 454 contacts a sidewall of the annular tunneling dielectric layer portion.

In one embodiment, the layer stack within a memory film 50 includes a blocking dielectric layer 52 that contacts the silicon nitride layer 54 and sidewalls of the insulating layers 32 of the alternating stack (32, 42).

In one embodiment, the blocking dielectric layer 52 comprises an annular blocking dielectric layer portion (i.e., a horizontally-extending portion having an annular shape of the blocking dielectric layer 52) through which the opening at the bottom portion of the memory film 50 extends. The silicon nitride ring 454 contacts a sidewall of the annular blocking dielectric layer portion. In one embodiment, the sidewall of the annular blocking dielectric layer portion is laterally recessed outward relative to an interface between a sidewall of the annular silicon nitride layer portion and the silicon nitride ring 454. The sidewall of the annular tunneling dielectric layer portion can be laterally recessed outward relative to the interface between the sidewall of the annular silicon nitride layer portion and the silicon nitride ring 454.

In one embodiment, a portion of the vertical semiconductor channel 60 contacting the silicon nitride ring 454 has a greater thickness than a portion of the vertical semiconductor channel 60 contacting the tunneling dielectric layer 56.

In one embodiment, the substrate (9, 10) comprises a single crystalline substrate semiconductor material layer (comprising the substrate semiconductor layer 9 and/or the semiconductor material layer 10) including a single crystalline substrate semiconductor material. A semiconductor material portion located at a bottom portion of each memory opening 49 can comprise an epitaxial pedestal structure 11 that includes a single crystalline semiconductor material that is in epitaxial alignment with the single crystalline substrate semiconductor material. In one embodiment, an entirety of a periphery between the vertical semiconductor channel 60 and the epitaxial pedestal structure 11 can be located on a surface of the silicon nitride ring 454.

In one embodiment, each of the memory opening fill structures 58 comprises a dielectric core 62 contacting an inner sidewall of the vertical semiconductor channel 60, and a drain region 63 including a doped semiconductor material and contacting a top end of the vertical semiconductor channel 60.

Figure 8:
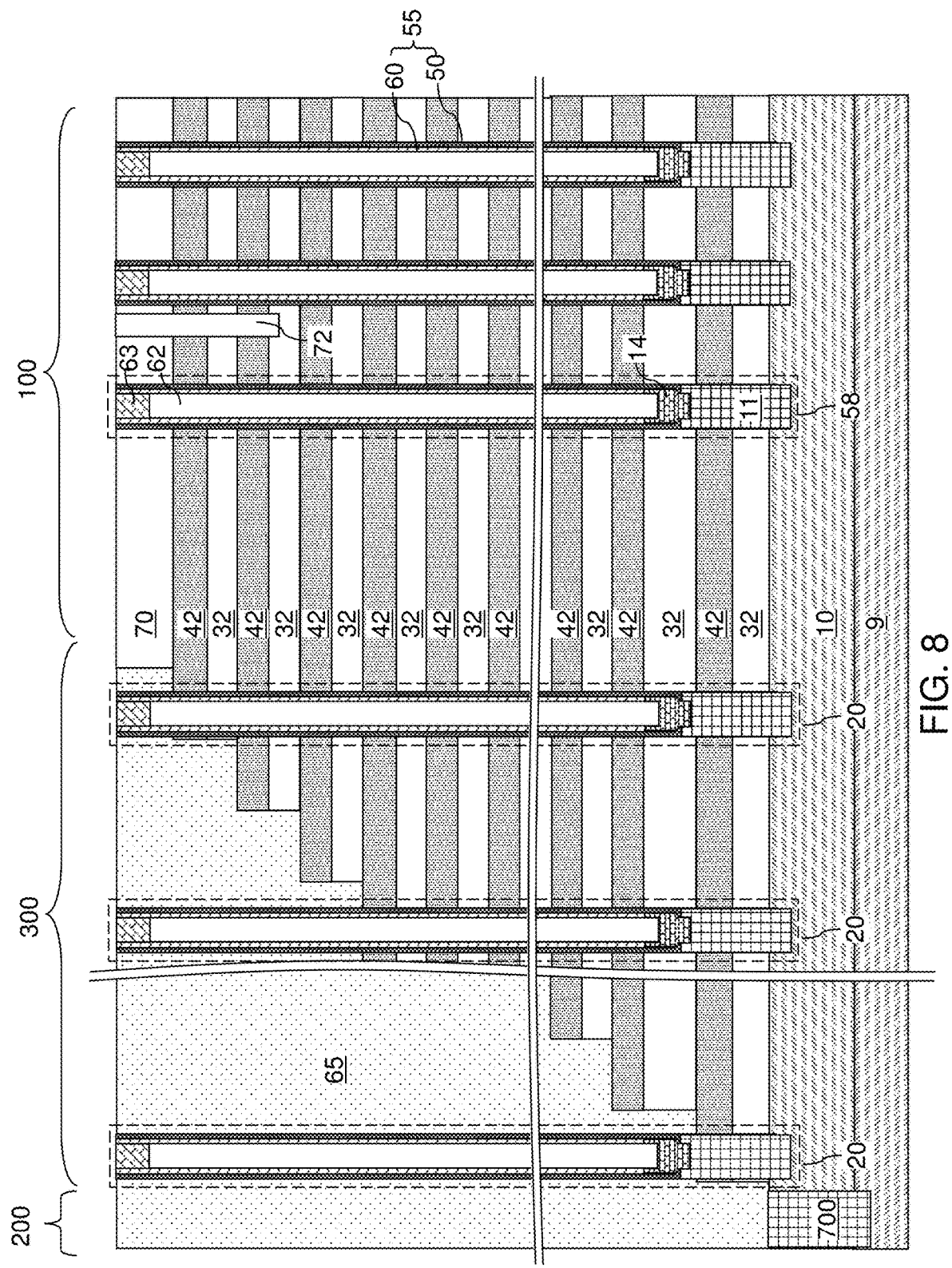
FIG. 8 is a schematic vertical cross-sectional view of the exemplary structure after formation of memory stack structures and support pillar structures according to an embodiment of the present disclosure.

Referring to FIG. 8, the exemplary structure is illustrated after the processing steps of FIG. 5N, i.e., after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60, a vertical stack of charge storage regions (comprising a silicon nitride layer 54) laterally surrounding the tunneling dielectric layer 56, and a blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 9A:
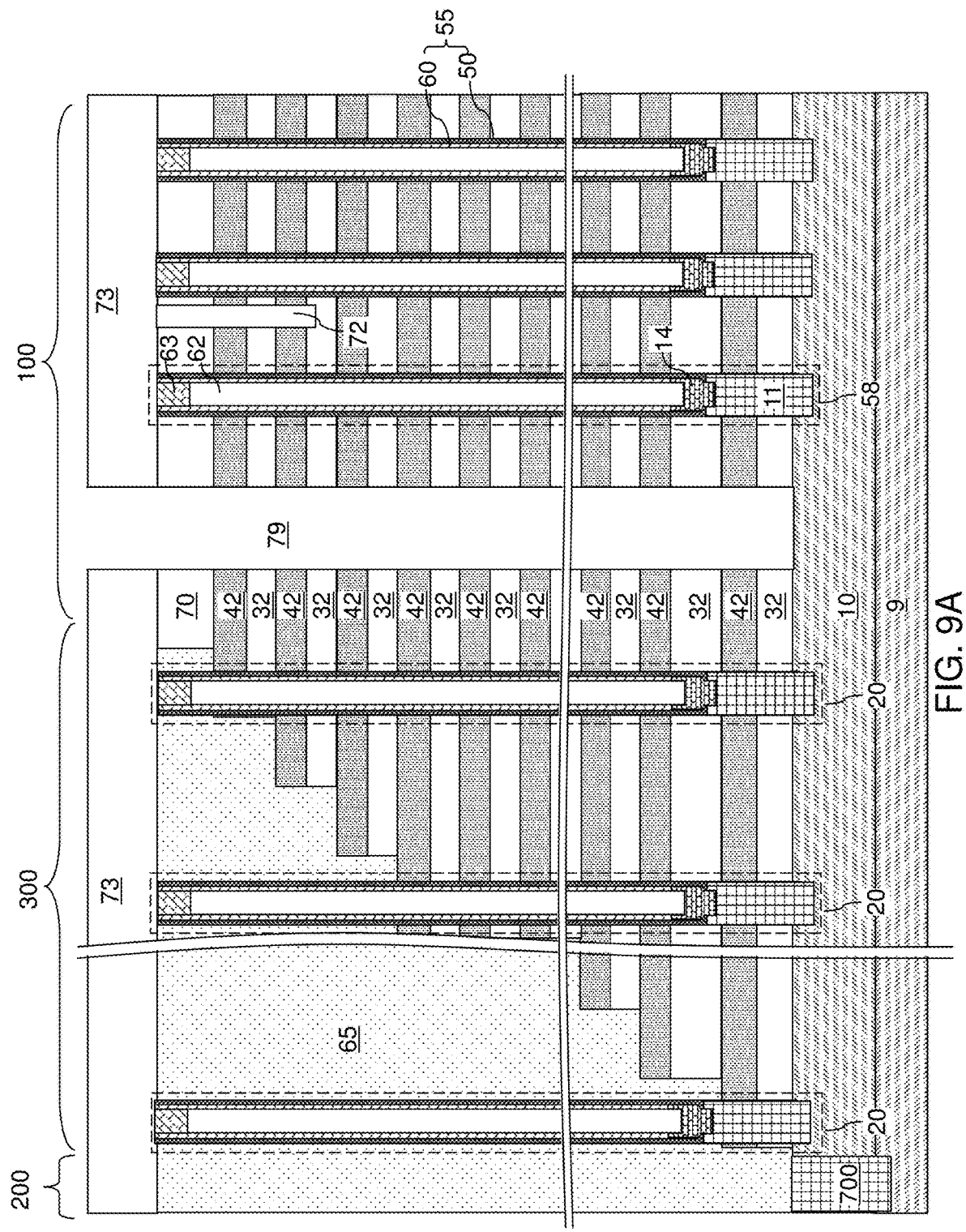
FIG. 9A is a schematic vertical cross-sectional view of the exemplary structure after formation of backside trenches according to an embodiment of the present disclosure.

Referring to FIGS. 9A and 9B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 10:
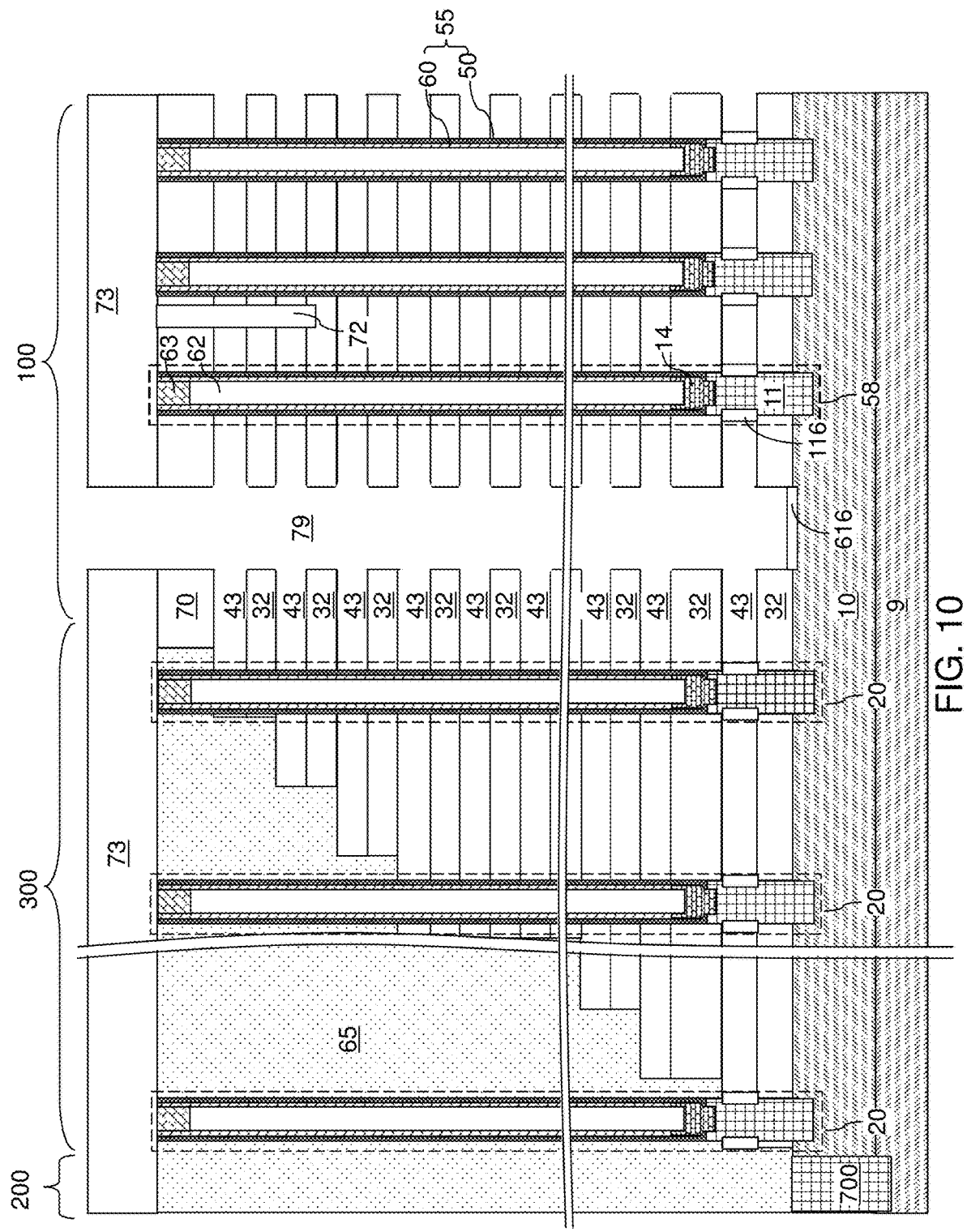
FIG. 10 is a schematic vertical cross-sectional view of the exemplary structure after formation of backside recesses according to an embodiment of the present disclosure.

Referring to FIGS. 10 and 11A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the epitaxial pedestal structures 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial pedestal structure 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial pedestal structures 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial pedestal structures 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 11B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 11D:
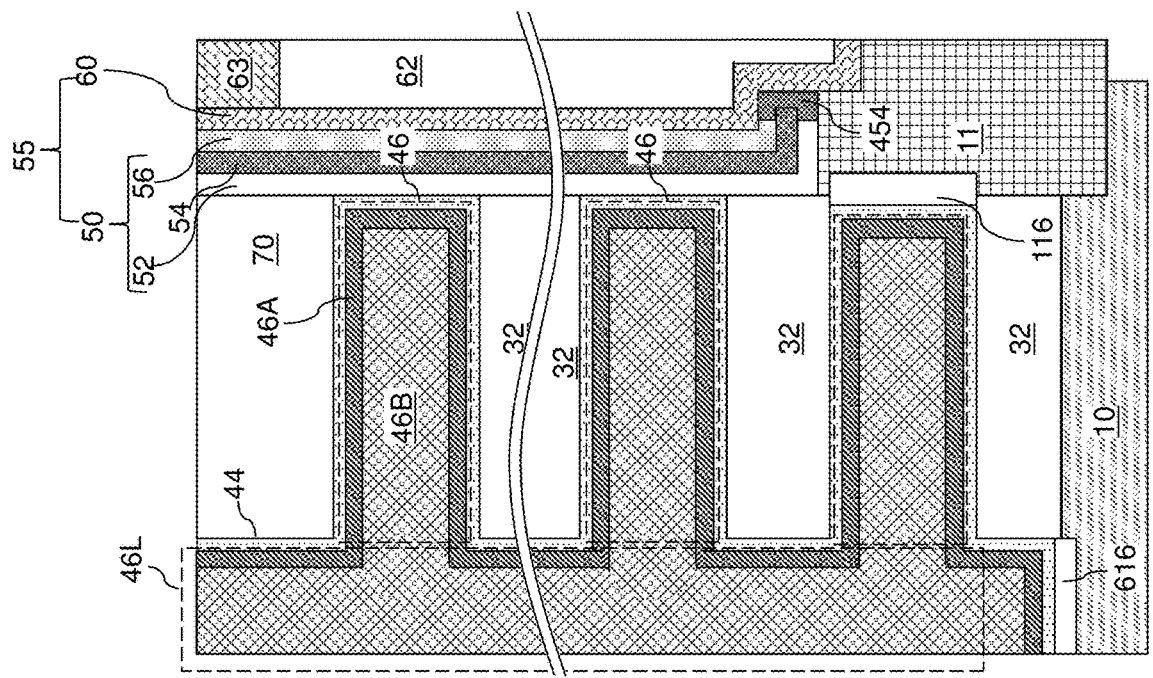
Figure 11C:
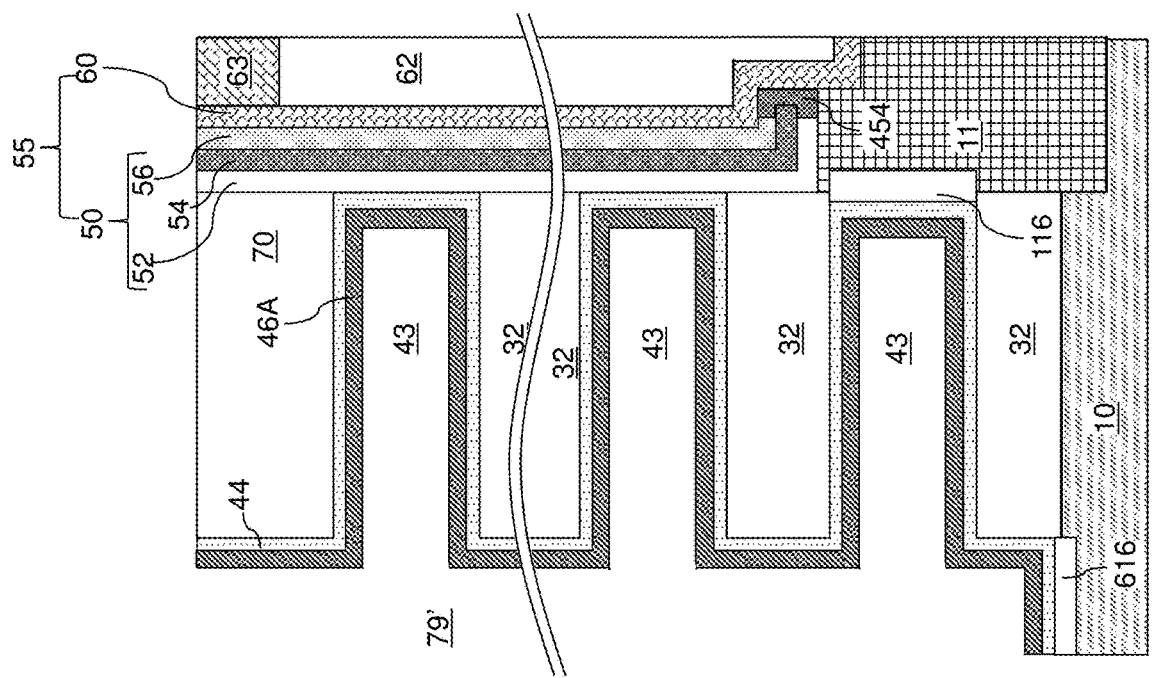

Referring to FIG. 11C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 12:
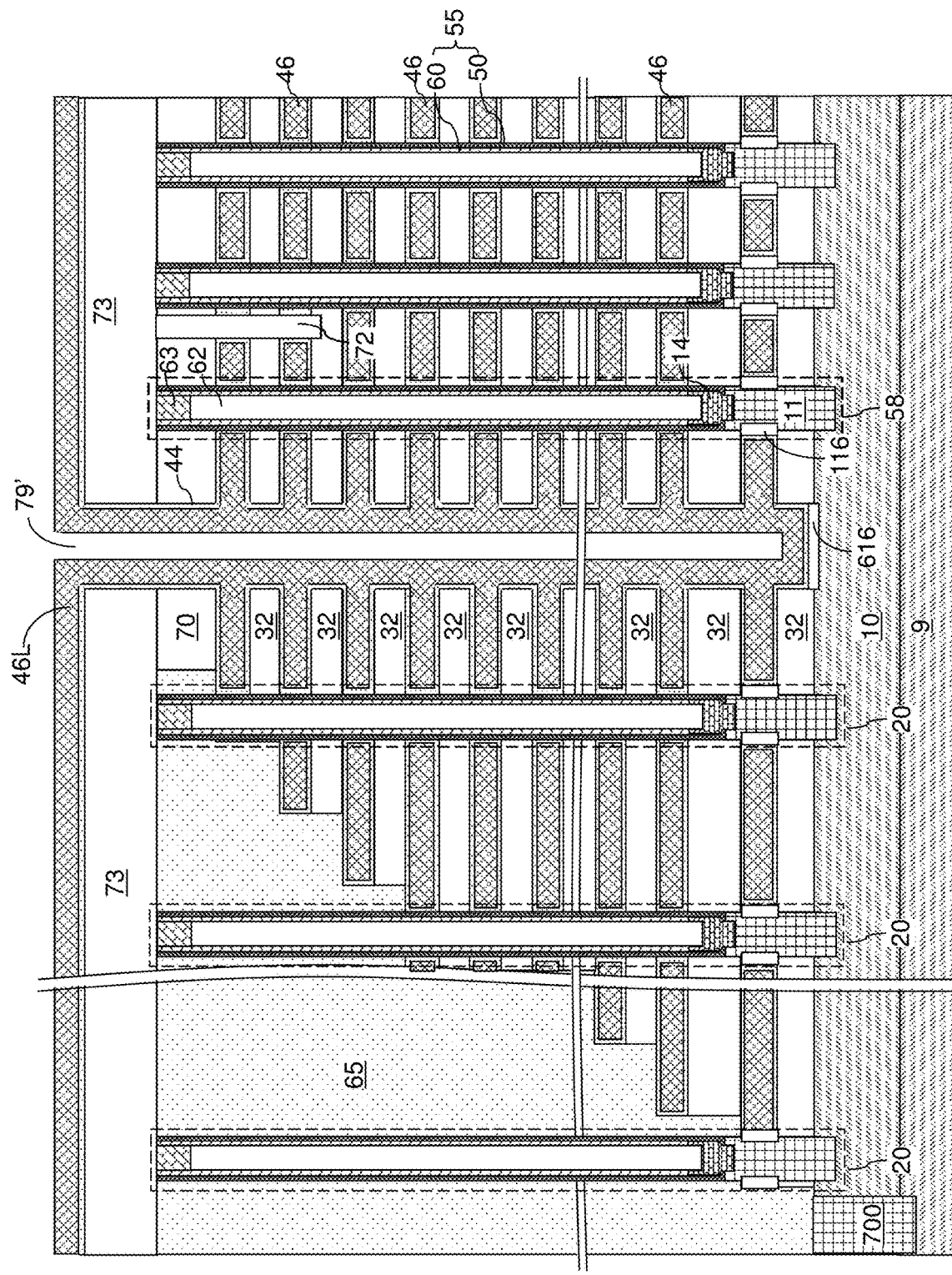
FIG. 12 is a schematic vertical cross-sectional view of the exemplary structure at the processing step of FIG. 11D.

Referring to FIGS. 11D and 12, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds an epitaxial pedestal structure 11. A bottommost electrically conductive layer 46 laterally surrounds each tubular dielectric spacer 116 upon formation of the electrically conductive layers 46.

Figure 13A:
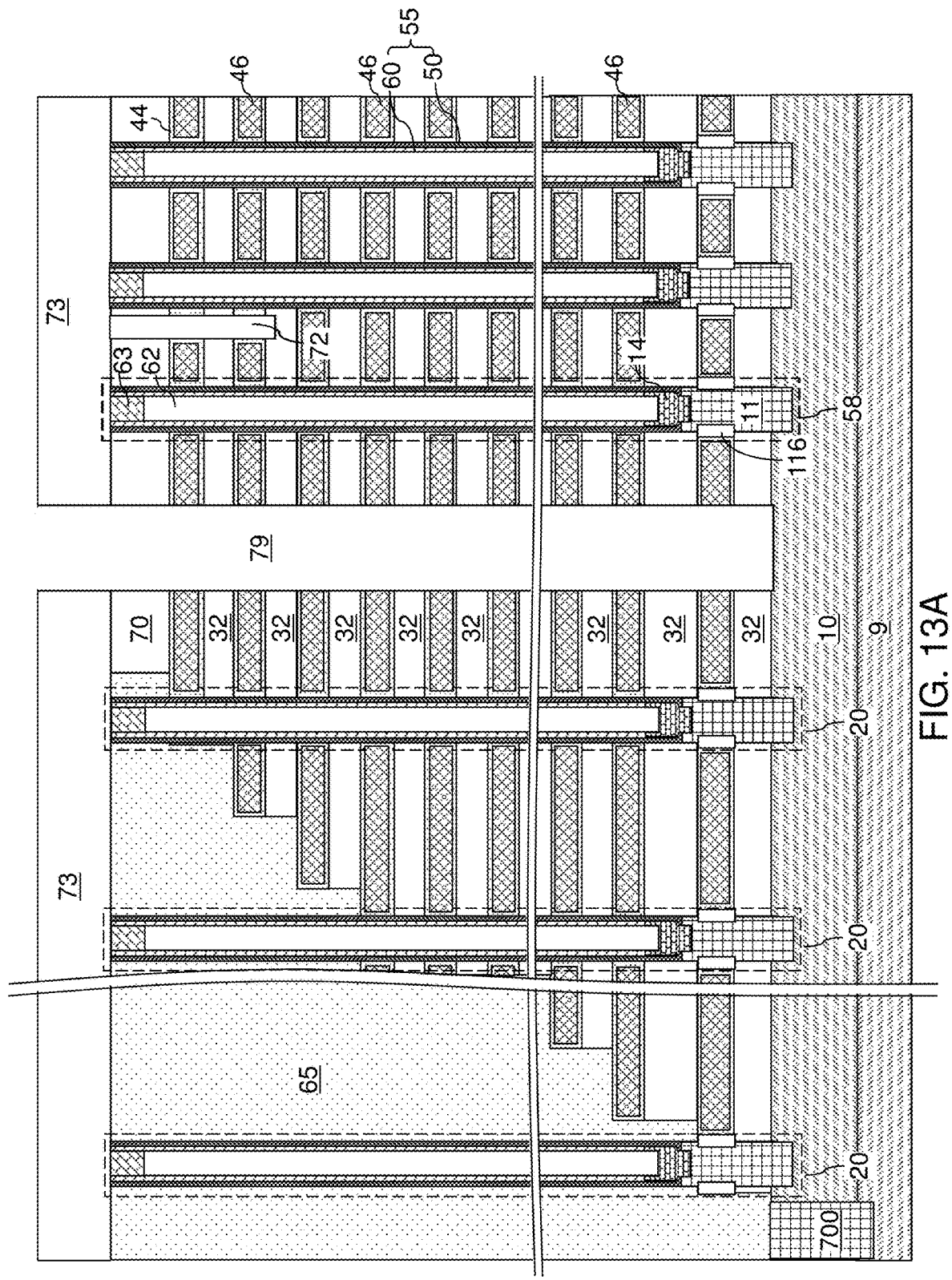
FIG. 13A is a schematic vertical cross-sectional view of the exemplary structure after removal of a deposited conductive material from within the backside trench according to an embodiment of the present disclosure.
Figure 13B:
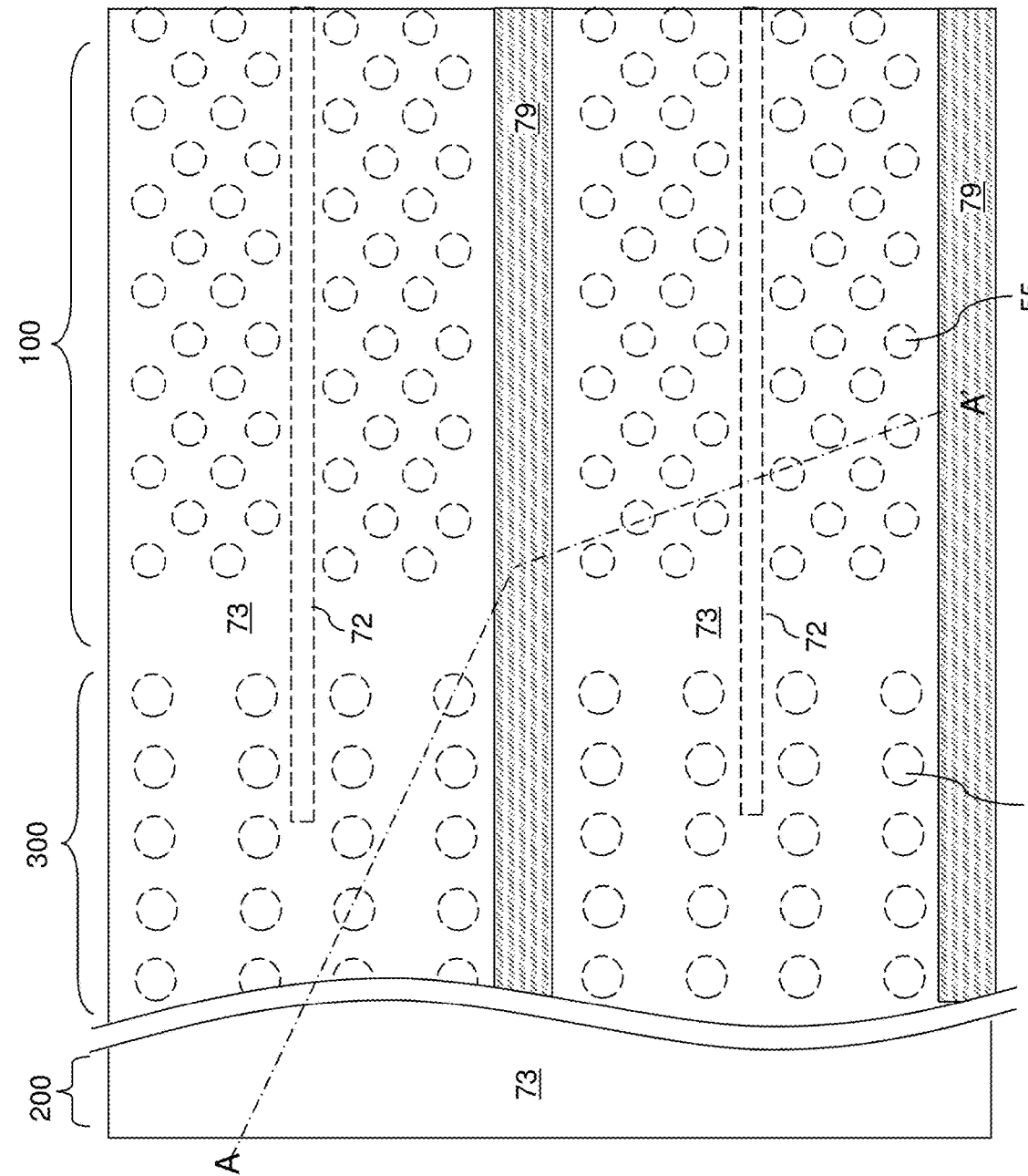
FIG. 13B is a partial see-through top-down view of the exemplary structure of FIG. 13A. The vertical plane A-A' is the plane of the schematic vertical cross-sectional view of FIG. 13A.

Referring to FIG. 13, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79. In one embodiment, each vertically neighboring pair of an insulating layer 32 and an electrically conductive layer 46 can be spaced from each other by a backside blocking dielectric layer 44 that contacts outer sidewalls of the memory opening fill structures 58.

Figure 14A:
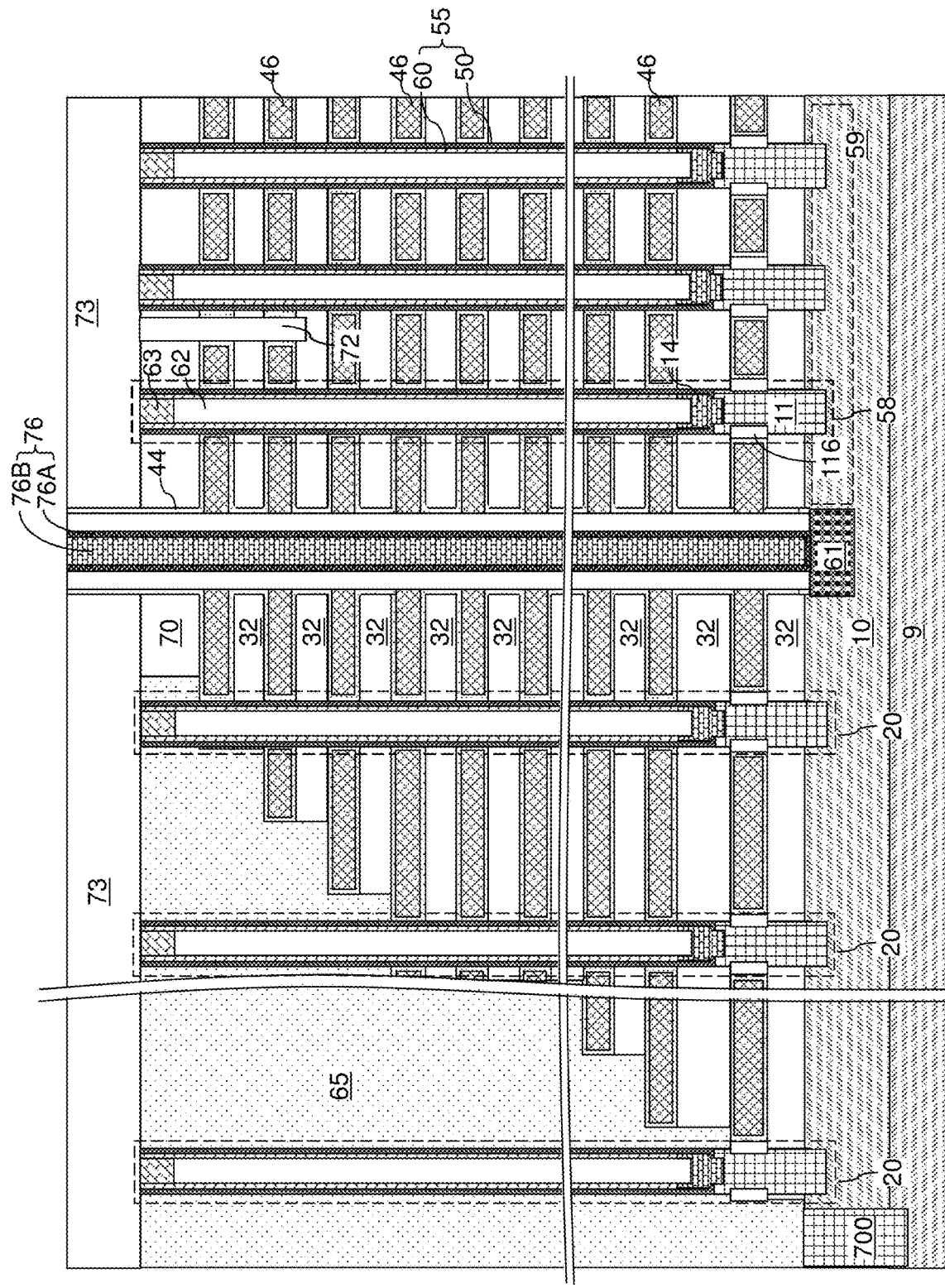
FIG. 14A is a schematic vertical cross-sectional view of the exemplary structure after formation of an insulating spacer and a backside contact structure according to an embodiment of the present disclosure.

Referring to FIGS. 14A and 14B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial pedestal structures 11 constitutes a horizontal semiconductor channel 59 for a plurality of field effect transistors. The horizontal semiconductor channel 59 is connected to multiple vertical semiconductor channels 60 through respective epitaxial pedestal structures 11. The horizontal semiconductor channel 59 contacts the source region 61 and the plurality of epitaxial pedestal structures 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 15A:
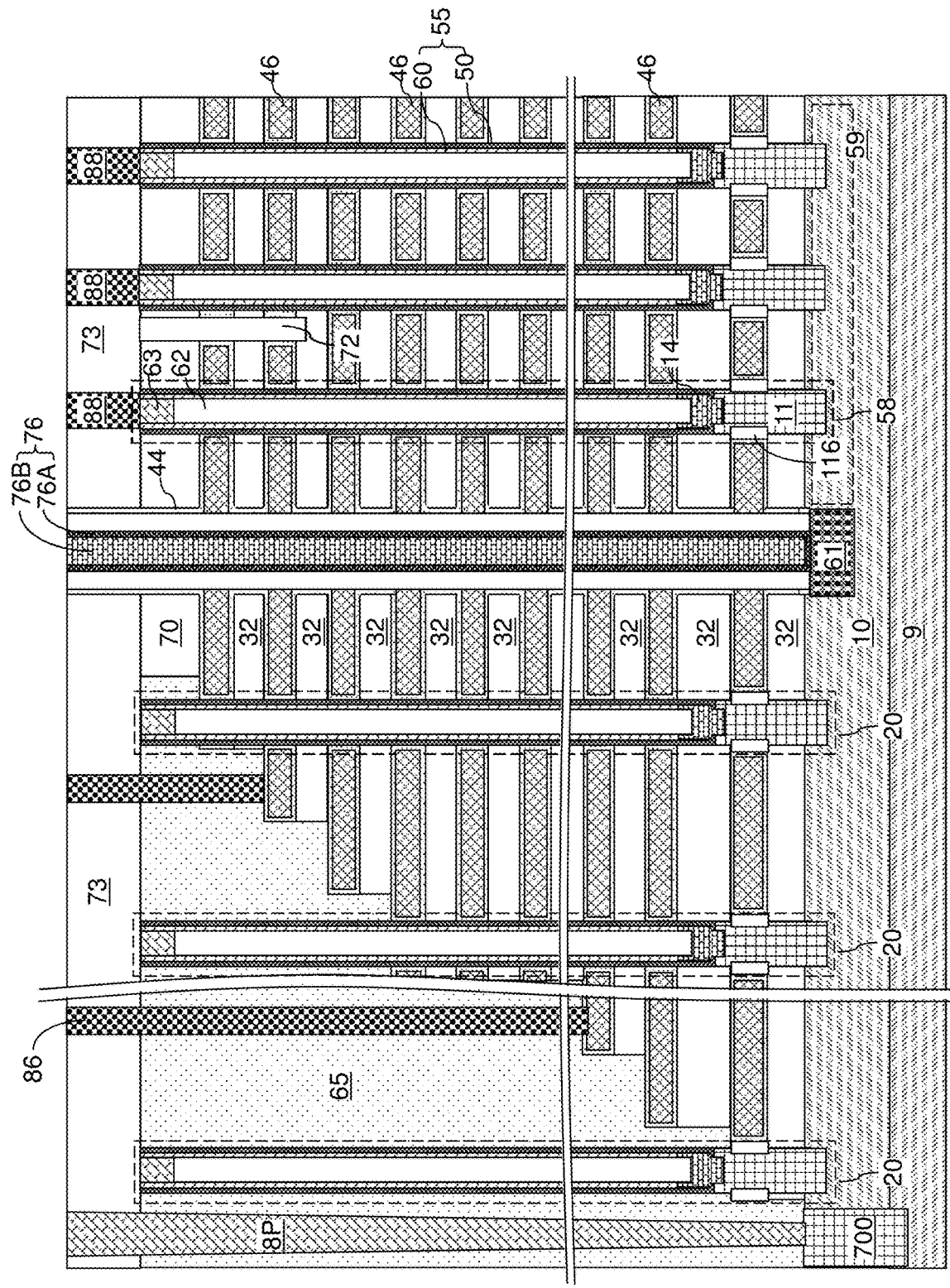
FIG. 15A is a schematic vertical cross-sectional view of the exemplary structure after formation of additional contact via structures according to an embodiment of the present disclosure.

Referring to FIGS. 15A and 15B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Layer contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a three-dimensional memory device is provided, which comprises: an alternating stack of insulating layers 32 and electrically conductive layers 46 located over a substrate (9, 10); memory openings 49 vertically extending through the alternating stack (32, 46); memory opening fill structures 58 located within a respective one of the memory openings 59, wherein each of the memory opening fill structures 58 comprises: a memory film 50 contacting a sidewall of a respective memory opening 49, comprising a layer stack including at least a tunneling dielectric layer 56 and a silicon nitride layer 54, and including an opening at a bottom portion thereof; a silicon nitride ring 454 contacting a sidewall of the opening in the memory film 50; and a vertical semiconductor channel 60 contacting an inner sidewall of a vertically-extending portion of the memory film 50 and extending through the silicon nitride ring 454 and contacting a semiconductor material portion (such as an epitaxial pedestal structure 11) that underlies the memory film 11 and the silicon nitride ring 454, wherein the silicon nitride ring 454 vertically extends from a top surface of the semiconductor material portion to a periphery of an interface between the tunneling dielectric layer 56 and the vertical semiconductor channel 60.

In one embodiment, each vertically neighboring pair of an insulating layer 32 and an electrically conductive layer 46 is spaced from each other by a backside blocking dielectric layer 44 that contacts outer sidewalls of the memory opening fill structures 58.

In one embodiment, the alternating stacks (32, 46) comprise stepped surfaces in a staircase region 300, wherein each electrically conductive layer 46 other than a topmost one of the electrically conductive layers 46 laterally extends farther than an overlying electrically conductive layer 46; layer contact via structures 86 contact a top surface of a respective one of the electrically conductive layers 46 in the staircase region 300; a retro-stepped dielectric material portion 65 overlies the stepped surfaces; and support pillar structures 20 extend through the retro-stepped dielectric material portion 65 and the stepped surfaces in the staircase region 300.

The cylindrical neck portion of a vertical semiconductor channel 60 that contacts an inner sidewall of a silicon nitride ring 454 provides a continuous physical and electrical connection between an underlying semiconductor material portion (such as an epitaxial pedestal structure 11) and a vertically-extending portion of the vertical semiconductor channel 60 that contacts an inner sidewall of a vertically-extending portion of the tunneling dielectric layer 56. The cylindrical neck portion of the vertical semiconductor channel 60 may have a greater thickness than the vertically-extending portion of the vertical semiconductor channel 60 that contacts the inner sidewall of the vertically-extending portion of the tunneling dielectric layer 56. Thus, the cylindrical neck portion of the vertical semiconductor channel 60 of the embodiment of the present disclosure can reduce the likelihood of channel 60 discontinuity and open circuit in the opening in the memory film 50 and/or reduce the resistance of a portion of the vertical semiconductor channel 60 that extends through an opening in a horizontal annular portion of the memory film 50, thereby increasing the on-current of each NAND string and enhancing the operability margin of the vertical field effect transistors within each NAND string.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate;
    memory openings vertically extending through the alternating stack; and
    memory opening fill structures located within a respective one of the memory openings, wherein each of the memory opening fill structures comprises:
    a memory film contacting a sidewall of a respective memory opening, comprising a layer stack including at least a tunneling dielectric layer and a silicon nitride layer, and including an opening at a bottom portion thereof;
    a silicon nitride ring contacting a sidewall of the opening in the memory film; and
    a vertical semiconductor channel contacting an inner sidewall of a vertically-extending portion of the memory film and extending through the silicon nitride ring and contacting a semiconductor material portion that underlies the memory film and the silicon nitride ring,
    wherein the silicon nitride ring vertically extends from a top surface of the semiconductor material portion to a periphery of an interface between the tunneling dielectric layer and the vertical semiconductor channel.

2. The three-dimensional memory device of claim 1, wherein:
    the silicon nitride layer comprises an annular silicon nitride layer portion through which the opening at the bottom portion of the memory film extends; and
    the tunneling dielectric layer comprises an annular tunneling dielectric layer portion through which the opening at the bottom portion of the memory film extends.

3. The three-dimensional memory device of claim 2, wherein the silicon nitride ring contacts a sidewall of the annular silicon nitride layer portion, an upper surface of the annular silicon nitride layer portion, and a lower surface of the annular silicon nitride layer portion.

4. The three-dimensional memory device of claim 2, wherein the silicon nitride ring contacts a sidewall of the annular tunneling dielectric layer portion.

5. The three-dimensional memory device of claim 2, wherein:
    the layer stack includes a blocking dielectric layer that contacts the silicon nitride layer and sidewalls of the insulating layers of the alternating stack;
    the blocking dielectric layer comprises an annular blocking dielectric layer portion through which the opening at the bottom portion of the memory film extends; and
    the silicon nitride ring contacts a sidewall of the annular blocking dielectric layer portion.

6. The three-dimensional memory device of claim 5, wherein:
    the sidewall of the annular blocking dielectric layer portion is laterally recessed outward relative to an interface between a sidewall of the annular silicon nitride layer portion and the silicon nitride ring; and
    the sidewall of the annular tunneling dielectric layer portion is laterally recessed outward relative to the interface between the sidewall of the annular silicon nitride layer portion and the silicon nitride ring.

7. The three-dimensional memory device of claim 1, wherein a portion of the vertical semiconductor channel contacting the silicon nitride ring has a greater thickness than a portion of the vertical semiconductor channel contacting the tunneling dielectric layer.

8. The three-dimensional memory device of claim 1, wherein:
    the vertical semiconductor channel comprises polysilicon;
    the substrate comprises single crystalline silicon; and
    the semiconductor material portion comprises a single crystal silicon epitaxial pedestal structure that is in epitaxial alignment with the substrate.

9. The three-dimensional memory device of claim 8, wherein an entirety of a periphery between the vertical semiconductor channel and the epitaxial pedestal structure is located on a surface of the silicon nitride ring.

10. The three-dimensional memory device of claim 1, wherein each of the memory opening fill structures comprises:
    a dielectric core contacting an inner sidewall of the vertical semiconductor channel; and
    a drain region including a doped semiconductor material and contacting a top end of the vertical semiconductor channel.

11. The three-dimensional memory device of claim 1, wherein each vertically neighboring pair of an insulating layer and an electrically conductive layer of the alternating stack is spaced from each other by a backside blocking dielectric layer that contacts outer sidewalls of the memory opening fill structures.

12. The three-dimensional memory device of claim 1, wherein:
    the alternating stacks comprise stepped surfaces in a staircase region, wherein each electrically conductive layer other than a topmost one of the electrically conductive layers laterally extends farther than an overlying electrically conductive layer;
    layer contact via structures contact a top surface of a respective one of the electrically conductive layers in the staircase region;
    a retro-stepped dielectric material portion overlies the stepped surfaces; and
    support pillar structures extend through the retro-stepped dielectric material portion and the stepped surfaces in the staircase region.

* * * * *